(12) United States Patent
Soejima

(10) Patent No.: US 11,054,259 B2
(45) Date of Patent: Jul. 6, 2021

(54) ANGULAR VELOCITY SENSOR, SENSOR ELEMENT, AND MULTI-AXIS ANGULAR VELOCITY SENSOR

(71) Applicant: KYOCERA Corporation, Kyoto (JP)

(72) Inventor: Munetaka Soejima, Soraku-gun (JP)

(73) Assignee: KYOCERA CORPORATION, Tokyo (JP)

( * ) Notice: Subject to any disclaimer, the term of this patent is extended or adjusted under 35 U.S.C. 154(b) by 0 days.

(21) Appl. No.: 16/320,084

(22) PCT Filed: Jul. 21, 2017

(86) PCT No.: PCT/JP2017/026389
§ 371 (c)(1),
(2) Date: Jan. 23, 2019

(87) PCT Pub. No.: WO2018/021166
PCT Pub. Date: Feb. 1, 2018

(65) Prior Publication Data
US 2019/0265033 A1 Aug. 29, 2019

(30) Foreign Application Priority Data
Jul. 26, 2016 (JP) .............................. JP2016-146353

(51) Int. Cl.
*G01C 19/5621* (2012.01)
*H01L 41/047* (2006.01)
(Continued)

(52) U.S. Cl.
CPC ........ *G01C 19/5621* (2013.01); *H01L 41/042* (2013.01); *H01L 41/047* (2013.01);
(Continued)

(58) Field of Classification Search
CPC ............ G01C 19/5719; G01C 19/5607; G01C 19/5691
See application file for complete search history.

(56) References Cited

U.S. PATENT DOCUMENTS 3,354,413 A * 11/1967 Yasuo Ko ................ H03H 9/48
333/200
5,451,828 A * 9/1995 Tomikawa ......... G01C 19/5607
310/321
(Continued)

FOREIGN PATENT DOCUMENTS

JP 2005-037235 A 2/2005
JP 2005-070030 A 3/2005
(Continued)

*Primary Examiner* — Helen C Kwok
(74) *Attorney, Agent, or Firm* — Volpe Koenig

(57) ABSTRACT

An angular velocity sensor includes a piezoelectric body, a drive circuit, and a detection circuit. The piezoelectric body includes a frame, a pair of drive arms, and a detection arm. The frame is supported in a pair of supported parts which are spaced apart from each other in an x-axis direction. The pair of drive arms extend alongside each other from the frame in a y-axis direction between the pair of supported parts and spaced apart from each other in the x-axis direction. The detection arm extends from the frame in the y-axis direction and is between the pair of drive arms in the x-axis direction. The drive circuit applies voltages of mutually reverse phases to the pair of drive arms so that the drive arms vibrate bending toward mutually reverse sides in the x-axis direction. The detection circuit detects signals generated due to bending deformation of the detection arm.

11 Claims, 13 Drawing Sheets

(51) Int. Cl.
   *H01L 41/04* (2006.01)
   *H01L 41/113* (2006.01)
   *H01L 41/09* (2006.01)

(52) U.S. Cl.
   CPC .......... *H01L 41/0475* (2013.01); *H01L 41/09* (2013.01); *H01L 41/113* (2013.01); *H01L 41/1132* (2013.01)

(56) References Cited

U.S. PATENT DOCUMENTS

| | | | | |
|---|---|---|---|---|
| 5,824,900 A * | 10/1998 | Konno | ................ | G01C 19/5607 73/504.16 |
| 6,151,965 A * | 11/2000 | Watarai | ............. | G01C 19/5607 73/504.16 |
| 6,584,844 B2 * | 7/2003 | Beitia | ................ | G01C 19/5607 73/504.16 |
| 6,747,393 B2 * | 6/2004 | Kikuchi | ............. | G01C 19/5607 310/321 |
| 7,246,520 B2 * | 7/2007 | Eguchi | ................... | G01C 19/56 73/504.15 |
| 9,222,775 B2 * | 12/2015 | Nakagawa | ......... | G01C 19/5621 |
| 2005/0011267 A1 | 1/2005 | Kikuchi | | |
| 2005/0061073 A1 * | 3/2005 | Kanna | ................ | G01C 19/5607 73/504.04 |
| 2006/0162446 A1 * | 7/2006 | Ogura | ................ | G01C 19/5607 73/504.12 |
| 2006/0162447 A1 * | 7/2006 | Ogura | ................ | G01C 19/5607 73/504.12 |
| 2008/0022769 A1 * | 1/2008 | Yamamoto | ......... | G01C 19/5607 73/504.16 |
| 2008/0178673 A1 * | 7/2008 | Tateyama | ........... | G01C 19/5607 73/504.15 |
| 2008/0236281 A1 * | 10/2008 | Noguchi | ............ | G01C 19/5607 73/504.16 |
| 2010/0000322 A1 * | 1/2010 | Honda | ............... | G01C 19/5621 73/504.16 |
| 2011/0179867 A1 * | 7/2011 | Amemiya | .......... | G01C 19/5607 73/504.12 |
| 2012/0256307 A1 * | 10/2012 | Koyama | ............ | G01C 19/5783 257/693 |
| 2013/0264913 A1 * | 10/2013 | Funakawa | ........... | H01L 41/0472 310/365 |
| 2016/0116285 A1 * | 4/2016 | Ogura | ................ | G01C 19/5705 73/504.12 |
| 2016/0282117 A1 * | 9/2016 | Nakagawa | ......... | G01C 19/5607 |
| 2017/0016724 A1 * | 1/2017 | Sakai | ................ | G01C 19/5614 |
| 2017/0016725 A1 * | 1/2017 | Shimizu | .......... | G01C 19/5642 |
| 2017/0310300 A1 * | 10/2017 | Yamada | .................... | H03B 5/32 |

FOREIGN PATENT DOCUMENTS

| | | |
|---|---|---|
| JP | 2015-087263 A | 5/2015 |
| JP | 2015-141182 A | 8/2015 |

* cited by examiner

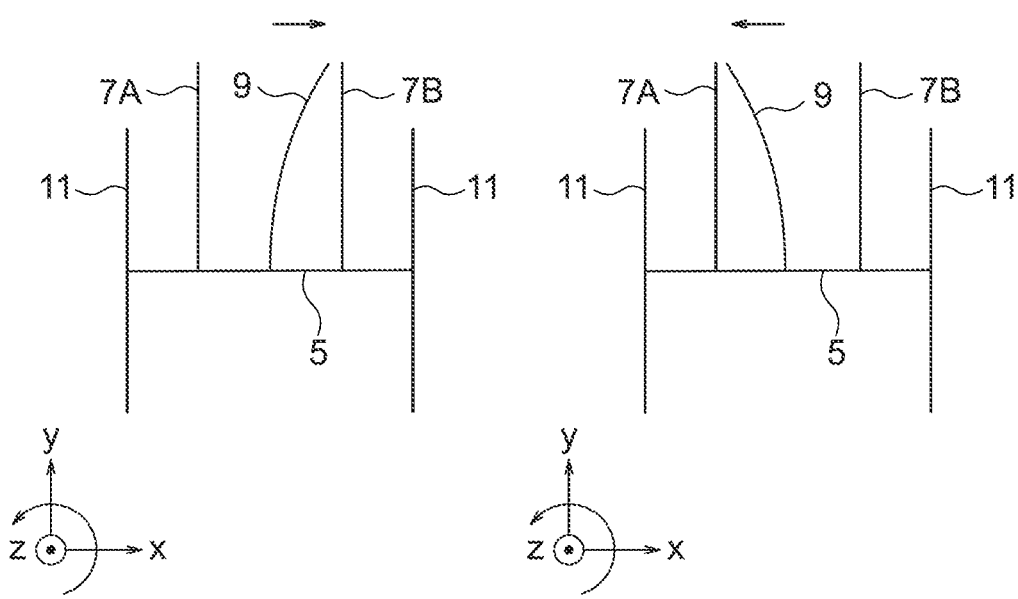

ANGULAR VELOCITY SENSOR, SENSOR ELEMENT, AND MULTI-AXIS ANGULAR VELOCITY SENSOR

TECHNICAL FIELD

The present disclosure relates to an angular velocity sensor, a sensor element used in the angular velocity sensor, and a multi-axis angular velocity sensor including the angular velocity sensor.

BACKGROUND ART

As an angular velocity sensor, a so-called "piezoelectric vibration type" one is known (for example, Patent Literature 1). In this sensor, an AC voltage is applied to a piezoelectric body to excite the piezoelectric body. When this excited piezoelectric body is rotated, a Coriolis force is generated with a magnitude corresponding to the rotational speed (angular velocity) in a direction perpendicular to the excitation direction. The piezoelectric body vibrates due to this Coriolis force as well. Further, by detecting an electrical signal generated in accordance with deformation of the piezoelectric body caused by this Coriolis force, the angular velocity of the piezoelectric body can be detected.

CITATION LIST

Patent Literature

Patent Literature 1: Japanese Patent Publication No. 2005-037235A

SUMMARY OF INVENTION

An angular velocity sensor according to one aspect of the present disclosure includes a piezoelectric body, a drive circuit, and a detection circuit. The piezoelectric body includes a frame, a pair of drive arms, and a detection arm. The frame is supported in a pair of supported parts which are spaced apart from each other in an x-axis direction in an orthogonal coordinate system xyz. The pair of drive arms extend alongside each other from the frame in a y-axis direction at positions between the pair of supported parts and spaced apart from each other in the x-axis direction. The detection arm extends from the frame in the y-axis direction at a position between the pair of drive arms in the x-axis direction. The drive circuit applies voltages of mutually reverse phases to the pair of drive arms so that the pair of drive arms vibrate bending toward mutually reverse sides in the x-axis direction. The detection circuit detects signals generated due to bending deformation of the detection arm in a z-axis direction or x-axis direction.

A sensor element according to one aspect of the present disclosure includes a piezoelectric body, a plurality of excitation electrodes, a plurality of detection electrodes, a plurality of pads, and a plurality of wirings. The piezoelectric body includes a frame, a pair of drive arms, and a detection arm. The pair of drive arms extend alongside each other from the frame in the y-axis direction at positions which are spaced apart from each other in the x-axis direction in the orthogonal coordinate system xyz. The detection arm extends from the frame in the y-axis direction at a position between the pair of first drive arms in the x-axis direction. The plurality of excitation electrodes are located in an arrangement capable of applying voltages exciting the pair of drive arms in the x-axis direction. The plurality of detection electrodes are located in an arrangement capable of detecting signals generated according to vibration of the detection arm in the x-axis direction or z-axis direction. The plurality of pads are provided in the piezoelectric body at positions closer to the two sides of the x-axis direction than the pair of drive arms. The plurality of wirings connect the plurality of excitation electrodes so that voltages of mutually reverse phases are applied from the plurality of excitation electrodes to the pair of drive arms so that the pair of drive arms vibrate bending toward mutually reverse sides in the x-axis direction.

A multi-axis angular velocity sensor according to one aspect of the present disclosure includes an x-axis sensor which detects an angular velocity around an x-axis in an orthogonal coordinate system xyz, a y-axis sensor which detects an angular velocity around a y-axis, and a z-axis sensor which detects an angular velocity around a z-axis. The x-axis sensor is the angular velocity sensor according to one aspect of the present disclosure. The y-axis sensor includes a piezoelectric body, a y-axis drive circuit, and a y-axis detection circuit. The piezoelectric body in the y-axis sensor includes a y-axis drive arm and a y-axis detection arm each extending in the y-axis direction. The y-axis drive circuit applies voltages to the y-axis drive arm so that the y-axis drive arm vibrates in the x-axis direction. The y-axis detection circuit detects signals generated due to bending deformation in the z-axis direction of the detection arm. The z-axis sensor is the angular velocity sensor according to one aspect of the present disclosure.

BRIEF DESCRIPTION OF DRAWINGS

FIG. 5A and FIG. 5B are schematic views for explaining the mode of operation of the sensor element in FIG. 4A.

DESCRIPTION OF EMBODIMENTS

Below, embodiments according to the present disclosure will be explained with reference to the drawings. Note that, the following drawings are schematic ones. Accordingly, details will be sometimes omitted. Further, size ratios etc. do not always coincide with actual ones. Further, size ratios etc. between two or more drawings do not always coincide with each other either.

Further, at each drawing, for convenience of explanation, an orthogonal coordinate system xyz is attached. Note that, the orthogonal coordinate system xyz is defined based on the shape of the sensor element (piezoelectric body). That is, the x-axis, y-axis, and z-axis do not always indicate an electrical axis, mechanical axis, and optical axis of a crystal. In the sensor element, any direction may be used as the "above" or "below". In the following description, however, for convenience, the "upper surface" or "lower surface" and other terms will be sometimes used where the positive side of the z-axis direction is the upper part. Further, when simply referring to "viewed on a plane", unless it is particularly explained, it means "viewed in the z-axis direction".

For the same or similar configurations, sometimes different letters of the alphabet will be attached such as the "drive arm 7A" and "drive arm 7B". Further, sometimes, the arms will be simply referred to as the "drive arms 7" and will not be differentiated.

In the second and following embodiments, for the configurations which are common with or similar to the configurations in the already explained embodiments, sometimes use will be made of the notations attached to the configurations in the already explained embodiments. Further, sometimes illustrations and explanations will be omitted. Note that, the configurations corresponding to (resembling) the configurations in the already explained embodiments are the same as the configurations in the already explained embodiments unless particularly explained even in a case where notations different from those of the configurations in the already explained embodiments are attached.

First Embodiment

Figure 1:
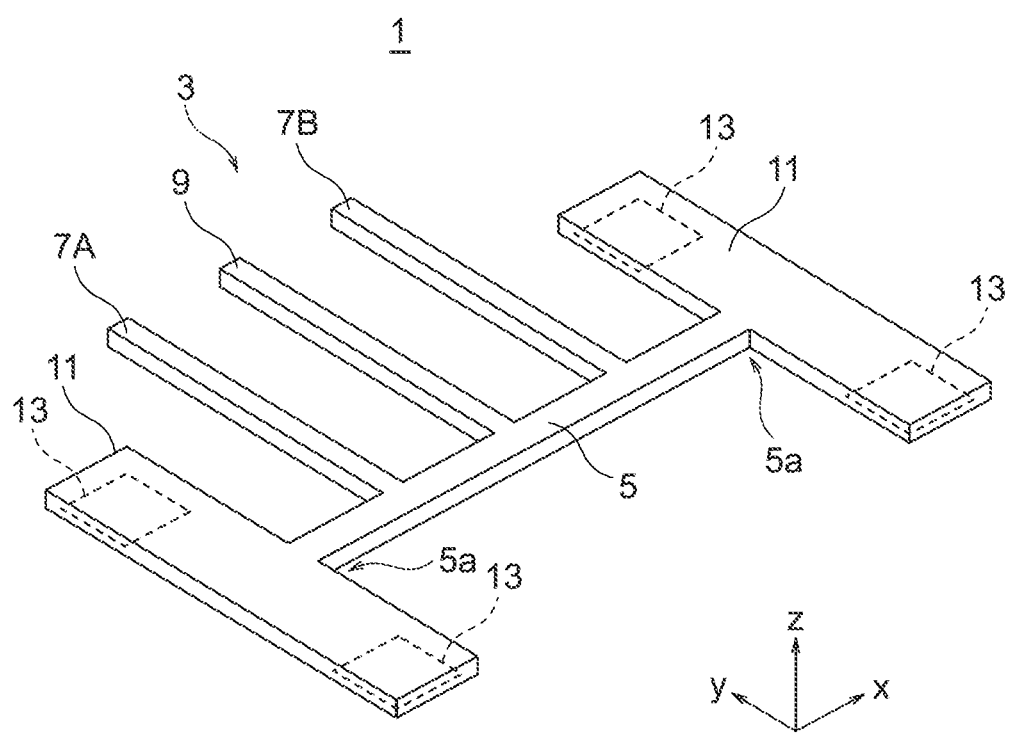
FIG. 1 is a perspective view showing a piezoelectric body in a sensor element according to an embodiment of the present disclosure.

FIG. 1 is a perspective view showing the configuration of a sensor element 1 according to a first embodiment. Note that, in this view, basically illustration of a conductive layer provided on the surface of the sensor element 1 is omitted.

Figure 2A:
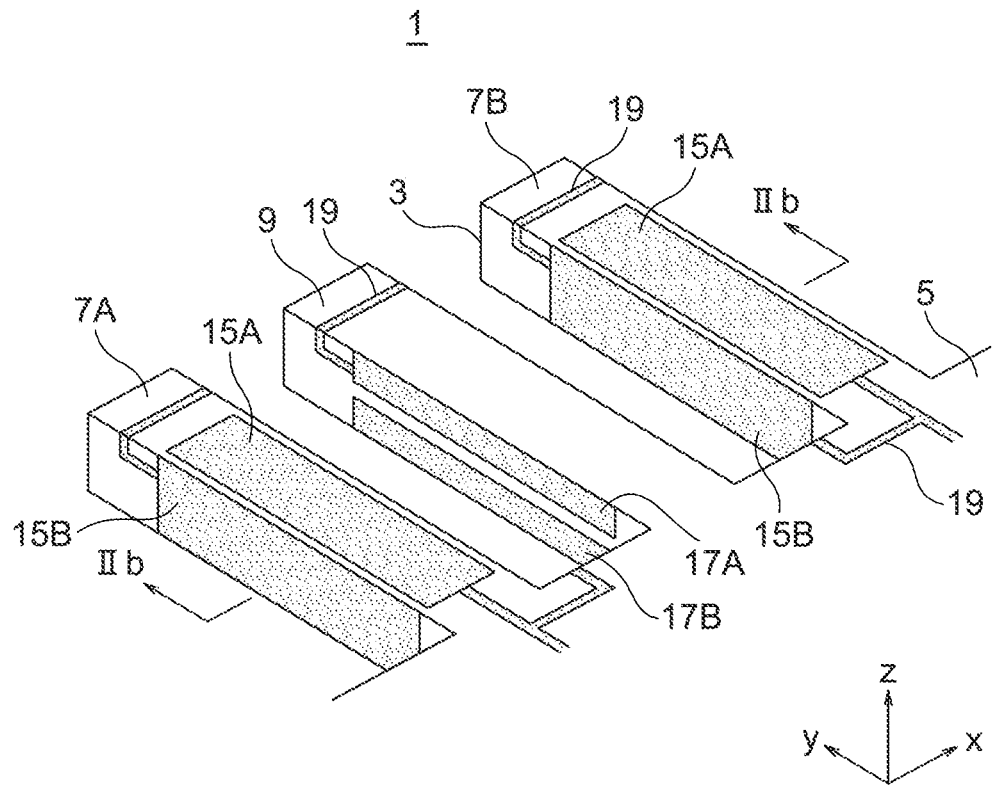
FIG. 2A is a perspective view showing a portion of the sensor element in FIG. 1 in an enlarged manner.
Figure 2B:
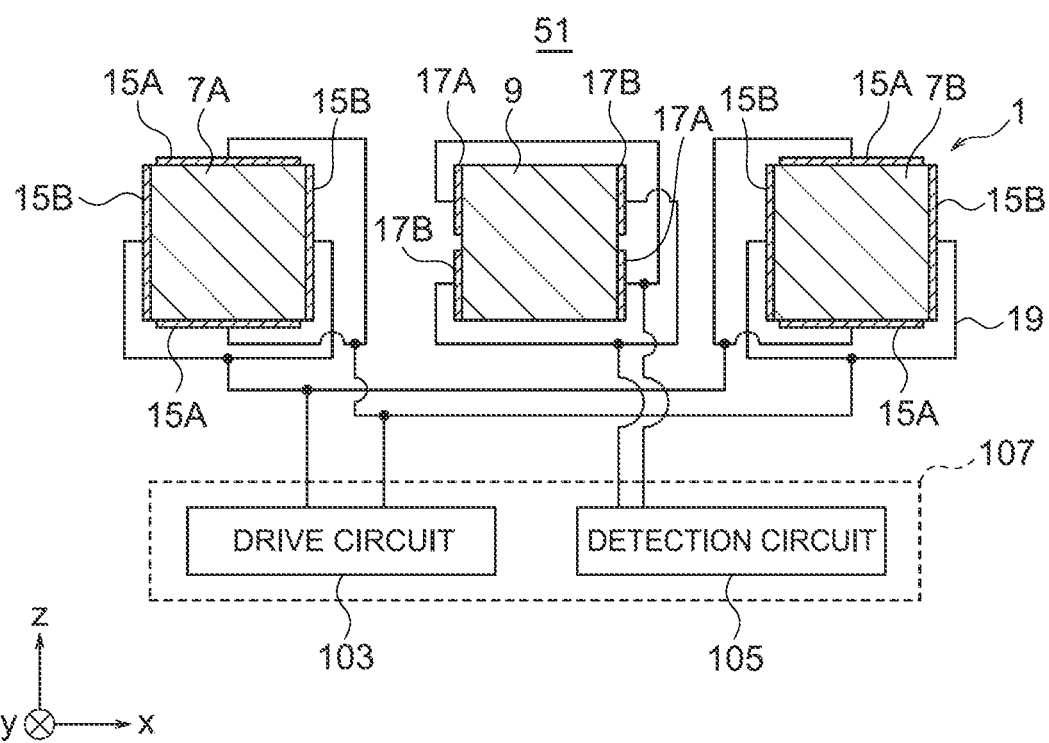
FIG. 2B is a cross-sectional view taken along the IIb-IIb line in FIG. 2A.

The sensor element 1 is for example one configuring an angular velocity sensor 51 (notation is shown in FIG. 2B) of a piezoelectric vibration type which detects the angular velocity around the x-axis. The sensor element 1 has a piezoelectric body 3. When the piezoelectric body 3 is rotated in a state where voltage is applied to the piezoelectric body 3 and the piezoelectric body 3 vibrates, vibration due to a Coriolis force is generated in the piezoelectric body 3. By detecting the voltage generated according to the vibration due to the Coriolis force, the angular velocity is detected. Specifically, this is as follows.

(Shape of Piezoelectric Body)

The piezoelectric body 3 is for example integrally formed as a whole. The piezoelectric body 3 may be a single crystal or polycrystal as well. Further, the material of the piezoelectric body 3 may be suitably selected. It is for example quartz crystal ($SiO_2$), $LiTaO_3$, $LiNbO_3$, PZT, or silicon.

In the piezoelectric body 3, the electrical axis or polarization axis (below, sometimes only the polarization axis will be referred to as the representative of the two) is set so as to coincide with the x-axis. Note that, the polarization axis may be inclined relative to the x-axis in a predetermined range (for example not more than 15°) as well. Further, in a case where the piezoelectric body 3 is a single crystal, the mechanical axis and optical axis may be set in suitable directions. For example, the mechanical axis is set in the y-axis direction, and the optical axis is set in the z-axis direction.

In the piezoelectric body 3, for example, the thickness (z-axis direction) is made constant as a whole. Further, the piezoelectric body 3 is for example formed in a linearly symmetrical shape relative to a not shown symmetrical axis parallel to the y-axis.

The piezoelectric body 3 has for example a frame 5, a pair of drive arms 7A and 7B and a detection arm 9 all extending from the frame 5, and a pair of mounting parts 11 which support the frame 5.

The pair of drive arms 7 is the part excited by application of voltages (electric fields). The detection arm 9 is a part which vibrates according to a Coriolis force and generates an electrical signal (for example voltage) corresponding to the angular velocity. The frame 5 is a part which contributes to support of the drive arms 7 and detection arm 9 and transfer of vibration from the drive arms 7 to the detection arm 9. The mounting parts 11 are parts which contribute to mounting of the sensor element 1 on a not shown mounting body (for example a portion of a package or circuit board).

The frame 5 is for example formed in a long shape so as to linearly extend in the x-axis direction. The two ends thereof become supported parts 5a which are supported by the pair of mounting parts 11. Accordingly, the frame 5 becomes able to deform to bend like a beam supported at the two ends.

The cross-sectional shape of the frame 5 is for example substantially rectangular. One of the width (y-axis direction) and the thickness (z-axis direction) of the frame 5 may be larger than the other as well. Note that, the frame 5 is planned to deform to bend when viewed on a plane as will be explained later. Accordingly, the width of the frame 5 may be made relatively small. For example, the width of the frame 5 may be made not more than 2 times or not more than 1 time the thickness of the frame 5. Further, for example, the length and width of the frame 5 may be adjusted so that a natural frequency of the flexural deformation becomes closer to the natural frequency of the drive arm 7 in the direction of being excited due to application of voltage and/or the natural frequency of the detection arm 9 in the direction of vibration due to the Coriolis force.

The drive arms 7 extend from the frame 5 in the y-axis direction. Their front ends are formed as free ends. Accordingly, the drive arms 7 become able to deform to bend in a cantilever manner. The pair of drive arms 7 extend standing aligned (for example in parallel) relative to each other at positions spaced apart from each other in the x-axis direction. The pair of drive arms 7 for example are provided linearly symmetrically relative to a not shown symmetrical axis passing through the center between the pair of supported parts 5a and parallel to the y-axis.

As will be explained later (FIG. 3A and FIG. 3B), the pair of drive arms 7 are intended to make the frame 5 deform to bend (vibrate) when viewed on a plane due to excitation in the x-axis direction. Accordingly, for example, the positions of the pair of drive arms 7 in the x-axis direction relative to the frame 5 may be suitably set so that the bending deformation of the frame 5 becomes large due to the vibration of the pair of drive arms 7. For example, when dividing a portion between the pair of supported parts 5a into three equal parts, the pair of drive arms 7 are respectively positioned at the two side regions.

A concrete shape etc. of the drive arm 7 may be suitably set. For example, the drive arm 7 is a long rectangular cuboid shape. That is, the cross-sectional shape (xz plane) is rectangular. Although not particularly shown, the drive arm 7 may be hammer shaped so that the width (x-axis direction) becomes broader at the front end side portion as well. The pair of drive arms 7 are for example given shapes and sizes which are substantially linearly symmetrical to each other. Accordingly, the vibration characteristics of the two are equivalent to each other.

The drive arms 7, as will be explained later, are excited in the x-axis direction. Accordingly, in the drive arms 7, the natural frequencies in the excitation direction (x-axis direction) become higher when their widths (x-axis direction) become larger, and the natural frequencies in the excitation direction become lower when their lengths (from another viewpoint, mass) become larger. The various dimensions of the drive arms 7 are for example set so that the natural frequencies of the drive arms 7 in the excitation direction become close to the frequencies at which excitation is to be caused.

The detection arm 9 extends from the frame 5 in the y-axis direction. Its front end is formed as the free end. Accordingly, the detection arm 9 becomes able to deform to bend in a cantilever manner. Further, the detection arm 9 extends between the pair of drive arms 7 aligned (for example parallel) relative to the pair of drive arms 7. The detection arm 9 is for example positioned at the center between the pair of supported parts 5a and/or positioned at the center between the pair of drive arms 7.

A concrete shape etc. of the detection arm 9 may be suitably set. For example, the detection arm 9 is a long rectangular cuboid shape. That is, the cross-sectional shape (xz plane) is rectangular. Although not particularly shown, the detection arm 9 may be hammer shaped so that the width (x-axis direction) becomes broader at the front end side portion as well.

The detection arm 9, as will be explained later, vibrates in the z-axis direction due to the Coriolis force in the present embodiment. Accordingly, in the detection arm 9, the natural frequency in the vibration direction (z-axis direction) becomes higher when its thickness (z-axis direction) becomes larger, and the natural frequency in the vibration direction becomes lower when its length (from another viewpoint, mass) becomes larger. The various dimensions of the detection arm 9 are for example set so that the natural frequency in the vibration direction of the detection arm 9 becomes close to the natural frequency in the excitation direction of the drive arm 7. The length of the detection arm 9 is for example equivalent to the length of the drive arm 7. Note that, the two may differ as well.

The pair of mounting parts 11 are for example formed in shapes with the y-axis direction as the long directions. More specifically, for example, the mounting parts 11 are plate shapes having rectangular planar shapes with the z-axis direction as the thickness directions. The widths (x-axis direction) of the mounting parts are for example broader than the width (y-axis direction) of the frame 5, the widths (x-axis direction) of the drive arms 7, and the width (x-axis direction) of the detection arm 9. Accordingly, the mounting parts 11 become harder to deform to bend when viewed on a plane in comparison with the other portions (5, 7, and 9). However, the mounting parts 11 may be narrowed in widths in parts or whole in comparison with the other parts (5, 7, or 9) as well. The lengths of the mounting parts 11 may be suitably set. For example, the lengths from the frame 5 up to single ends of the mounting parts 11 may be shorter than the lengths of the drive arms 7 or detection arm 9 (example shown), may be equivalent, or may be longer.

The frame 5, as already explained, is fixed at its two ends (supported parts 5a) to the pair of mounting parts 11. The positions of the supported parts 5a in the y-axis direction relative to the mounting parts 11 may be suitably set. In the example shown, the supported parts 5a are positioned at the centers of the mounting parts 11 in the y-axis direction.

At least four pads 13 are provided on the lower surfaces of the pair of mounting parts 11. The pads 13 face pads provided on a not shown mounting body and are bonded with respect to those pads on the mounting body by bumps made of solder or conductive adhesive. Due to this, the sensor element 1 and the mounting body are electrically connected. Further, the sensor element 1 (piezoelectric body 3) is supported in a state where the drive arms 7 and the detection arm 9 can vibrate. The four pads 13 are for example respectively provided at the two ends of the pair of mounting parts 11.

(Excitation Electrodes, Detection Electrodes, and Wiring)

FIG. 2A is a perspective view showing a portion of the sensor element 1 in an enlarged manner. Further, FIG. 2B is a cross-sectional view taken along the IIb-IIb line in FIG. 2A.

The sensor element 1 has excitation electrodes 15A and 15B for applying voltages to the drive arms 7, detection electrodes 17A and 17B for extracting signals generated in the detection arm 9, and a plurality of wirings 19 connecting them. They are configured by a conductive layer formed on the surface of the piezoelectric body 3. The material of the conductive layer is for example Cu, Al, or another metal.

Note that, additional notations A and B of the excitation electrodes 15 and detection electrodes 17 are attached based on the orthogonal coordinate system xyz. Accordingly, as will be explained later, the excitation electrode 15A of one drive arm 7 and the excitation electrode 15A of the other drive arm 7 do not always have the same potential. The same is true also for the excitation electrodes 15B. In an aspect provided with a plurality of detection arms 9 (embodiment which will be explained later), the same is true also for the detection electrodes 17A and 17B.

In each drive arm 7, the excitation electrodes 15A are provided on each of the upper surface and lower surface (a pair of surfaces which face the two sides in the z-axis direction). Further, in each drive arm 7, the excitation electrodes 15B are provided on each of a pair of side surfaces (pair of surfaces which face the two sides in the x-axis direction).

Note that, in the embodiments explained later, sometimes provision is made of drive arms 7 which extend from the frame 5 toward the negative side of the y-axis direction. Even in such drive arms 7, the additional notations A of the excitation electrodes 15 correspond to the upper surface and lower surface, and the additional notations B of the excitation electrodes 15 correspond to the side surfaces.

On the upper, lower, left, and right surfaces of each drive arm 7, the excitation electrodes 15 are for example formed so as to cover over the major parts of the surfaces. However, at least some of the excitation electrodes 15A and 15B (excitation electrodes 15A in the present embodiment) are formed smaller in the width direction than the surfaces so that the electrodes will not be short-circuited with each other. Further, portions of the drive arms 7 on the root side and front end side may be set aside as positions where no excitation electrodes 15 are arranged.

In each drive arm 7, the two excitation electrodes 15A are for example given the same potentials as each other. For example, the two excitation electrodes 15A are mutually connected by the wiring 19. Further, in each drive arm 7, the two excitation electrodes 15B are for example given the same potentials as each other. For example, the two excitation electrodes 15B are mutually connected by the wiring 19.

In such an arrangement and connection relationships of the excitation electrodes 15, when voltages are applied to the excitation electrodes 15A and the excitation electrodes 15B, for example, in the drive arm 7, an electric field from the upper surface toward the pair of side surfaces (the two sides in the x-axis direction) and an electric field from the lower surface toward the pair of side surfaces are generated. On the other hand, the polarization axis coincides with the x-axis direction. Accordingly, when paying attention to the components in the x-axis direction of the electric fields, the orientation of the electric field and the orientation of the polarization axis coincide in one side portion in the x-axis direction in the drive arm 7, while the orientation of the electric field and the orientation of the polarization axis become reverse in the other side portion.

As a result, in each drive arm 7, one side portion in the x-axis direction contracts in the y-axis direction, and the other side portion extends in the y-axis direction. Further, the drive arm 7 is bent to one side of the x-axis direction like a bimetal. If the voltages applied to the excitation electrodes 15A and 15B are inverted, the drive arm 7 is bent to a reverse direction. According to such a principle, when an AC voltage is applied to the excitation electrodes 15A and 15B, the drive arm 7 vibrates in the x-axis direction.

Note that, although not particularly shown, on the upper surface and/or lower surface of each drive arm 7, one or more recessed grooves extending along the long direction of the drive arm 7 (the recessed groove may be configured by concave portions arranged in the long direction of the drive arm 7 as well) may be provided, and the excitation electrode 15A may be provided over the interior of this recessed groove as well. This case results due to the excitation electrode 15A and the excitation electrode 15B facing each other in the x-axis direction while sandwiching the wall portion of the recessed groove therebetween, therefore the efficiency of excitation is improved.

In the pair of drive arms 7, the excitation electrodes 15A on the drive arm 7A and the excitation electrodes 15B on the drive arm 7B are given the same potential, and the excitation electrodes 15B on the drive arm 7A and the excitation electrodes 15A on the drive arm 7B are given the same potential. For example, the excitation electrodes 15 to be given the same potential are mutually connected by the wiring 19.

Accordingly, if an AC voltage is applied to the excitation electrodes 15A and the excitation electrodes 15B in such connection relationships, voltages of mutually reverse phases are applied to the pair of drive arms 7, therefore they vibrate so as to deform bending in mutually reverse directions in the x-axis direction.

The detection electrodes 17A, in the detection arm 9, are provided in each of a region on the positive side of the z-axis direction in the surface facing the negative side of the x-axis direction (for example the positive side from the center of this surface) and a region on the negative side of the z-axis direction in the surface facing the positive side of the x-axis direction (for example the negative side from the center of this surface). The detection electrodes 17B, in detection arm 9, are provided in each of a region on the negative side of the z-axis direction in the surface facing the negative side of the x-axis direction (for example the negative side from the center of this surface) and a region on the positive side of the z-axis direction in the surface facing the positive side of the x-axis direction (for example the positive side from the center of this surface).

Note that, in the embodiments which will be explained later, sometimes provision is made of a detection arm 9 which extends from the frame 5 toward the negative side of the y-axis direction. Even in such a detection arm 9, the additional notations A of the detection electrode 17 correspond to the region of +z on the side surface of −x and to the region of −z on the side surface of +x, and the additional notations B of the detection electrode 17 correspond to the region of −z on the side surface of −x and to the region of +z on the side surface of +x.

On each side surface of the detection arm 9, the detection electrodes 17A and 17B extend along the detection arm 9 while suitably spaced apart from each other so as not to be short-circuited with each other. The two detection electrodes 17A are for example mutually connected by the wiring 19. Further, the two detection electrodes 17B are for example mutually connected by the wiring 19.

In such arrangement and connection relationships of the detection electrodes 17, if the detection arm 9 causes a flexural deformation in the z-axis direction, for example, an electric field parallel to the z-axis direction is generated. That is, on each side surface of the detection arm 9, a voltage is generated between the detection electrode 17A and the detection electrode 17B. The orientation of the electric field is determined by the orientation of the polarization axis and the orientation of the bending (positive side or negative side of the z-axis direction). The orientations of the electric fields are reverse to each other between the positive side portion and the negative side portion of the x-axis direction. These voltages (electric fields) are output to the detection electrodes 17A and detection electrodes 17B. When the detection arm 9 vibrates in the z-axis direction, the voltages are detected as the AC voltage. Note that, among the electric fields, the electric field parallel to the z-axis direction as described above may be dominant or the ratio of the electric fields which are parallel to the x-axis direction and have mutually reverse orientations between the positive side portion and the negative side portion of the z-axis direction may be larger. In any case, voltage in accordance with the bending deformation to the z-axis direction of the detection arm 9 is generated between the detection electrode 17A and the detection electrode 17B.

Note that, although not particularly shown, in the detection arm 9, one or more through grooves (slits) penetrating through it from the upper surface to the lower surface and extending along the long direction of the detection arm 9 may be formed as well. Further, in each of the two or more long shaped portions divided by the through grooves, like in the detection arm 9 in the example shown, the detection electrodes 17A and 17B may be arranged and connected as well. In this case, the plurality of detection electrodes 17 become larger in the area as a whole in comparison with the case where they are provided only on the outer side surfaces of the detection arm 9. As a result, a charge generated in the detection arm 9 can be efficiently extracted as an electrical signal.

The plurality of wirings 19 connect the excitation electrodes 15 and the detection electrodes 17 as explained above. Further, the plurality of wirings 19 connect four sets in total of electrodes of two sets of the excitation electrode 15 divided from the viewpoint of the potential and two sets of the detection electrodes 17 divided from the viewpoint of the potential with the four pads 13. By the plurality of wirings 19 being suitably arranged on the upper surfaces, lower surfaces, and/or side surfaces of various parts in the piezoelectric body 3, in an embodiment where all of the wirings are provided on the surfaces of the piezoelectric body 3, the above connections can be realized without short-circuiting with each other. Note that, by providing an insulation layer on the wirings 19 positioned on the piezoelectric body 3 and providing the other wirings 19 on that, a three-dimensional wiring portion may be formed as well.

As shown in FIG. 2B, the angular velocity sensor 51 has a drive circuit 103 applying voltages to the excitation electrodes 15 and a detection circuit 105 detecting the electrical signals from the detection electrodes 17.

The drive circuit 103 is for example configured including an oscillation circuit and amplifier and applies an AC voltage having a predetermined frequency to the excitation electrode 15A and the excitation electrode 15B. Note that, the frequency may be determined in advance in the angular velocity sensor 51 or may be designated from an apparatus in an external portion.

The detection circuit 105 is configured including for example an amplifier and wave detecting circuit, detects a potential difference between the detection electrode 17A and the detection electrode 17B, and outputs an electrical signal in accordance with the detection result to the apparatus in the external portion, or the like. More specifically, for example, the above potential difference is detected as the AC voltage, and the detection circuit 105 outputs a signal in accordance with the amplitude of the detected AC voltage. The angular velocity is specified based on this amplitude. Further, the detection circuit 105 outputs a signal in accordance with a phase difference between the application voltage of the drive circuit 103 and the electrical signal detected. The orientation of rotation is specified based on this phase difference.

Note that, the drive circuit 103 and the detection circuit 105 configure a control circuit 107 as a whole. The control circuit 107 is configured by for example an IC (integrated circuit) chip and is mounted on a circuit board or a mounting body having a suitable shape on which the sensor element 1 is mounted.

(Operation of Angular Velocity Sensor)

Figure 3A:
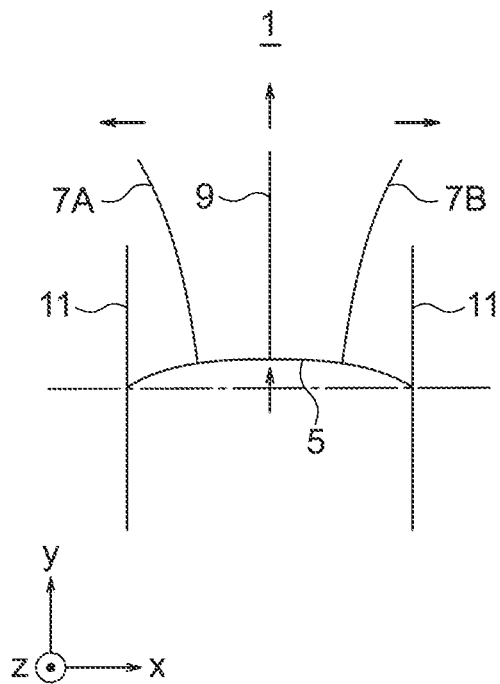
FIG. 3A, FIG. 3B, FIG. 3C, and FIG. 3D are schematic views for explaining the mode of operation of the sensor element in FIG. 1.
Figure 3B:
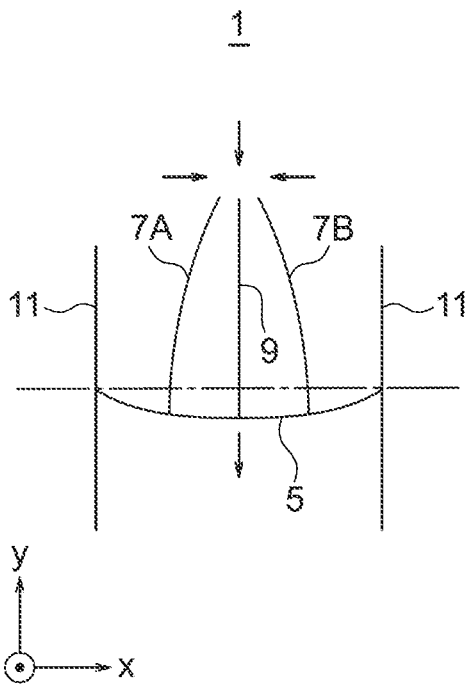

FIG. 3A and FIG. 3B are schematic plan views for explaining the excitations in the piezoelectric body 3. In the two views, phases of the AC voltages applied to the excitation electrodes 15 are mutually offset by 180°.

As explained above, the drive arms 7A and 7B are excited with mutually reverse phases so as to be deformed in mutually reverse orientations in the x-axis direction by application of the AC voltages to the excitation electrodes 15.

At this time, as shown in FIG. 3A, if the pair of drive arms 7 warp to the outer sides of the x-axis direction relative to each other, the bending moments thereof are transferred to the frame 5, therefore the frame 5 warps to the positive side of the y-axis direction. As a result, the detection arm 9 is displaced to the positive side of the y-axis direction.

Conversely, as shown in FIG. 3B, if the pair of drive arms 7 warp to the inner sides in the x-axis direction relative to each other, the bending moments thereof are transferred to the frame 5, therefore the frame 5 is displaced to the negative side of the y-axis direction. As a result, the detection arm 9 is displaced to the negative side of the y-axis direction.

Accordingly, by excitation of the pair of drive arms 7, the detection arm 9 ends up vibrating in the y-axis direction.

Figure 3C:
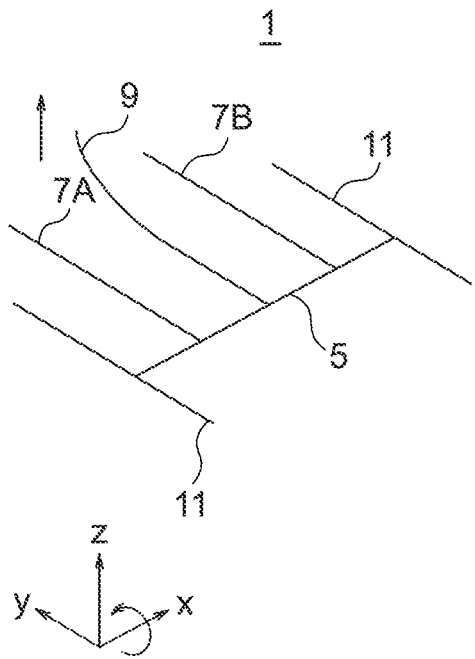
Figure 3D:
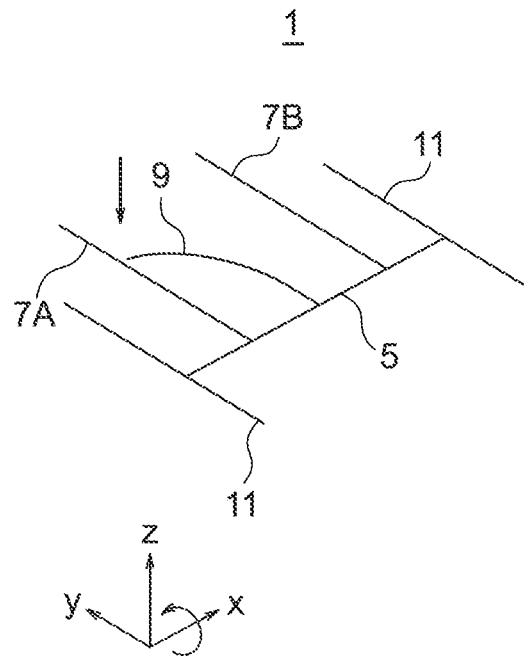

FIG. 3C and FIG. 3D are schematic perspective views for explaining the vibration of the detection arm 9 according to the Coriolis force. FIG. 3C and FIG. 3D correspond to the states in FIG. 3A and FIG. 3B. Note that, in these views, illustration is omitted for deformations of the drive arms 7 and frame 5. The same is true also for the schematic views for explaining the vibration of the detection arm 9 in the other embodiments which will be explained later.

When the sensor element 1 is rotated around the x-axis in the state where the piezoelectric body 3 is vibrating as explained with reference to FIG. 3A and FIG. 3B, since the detection arm 9 is vibrating (is being displaced) in the y-axis direction, vibration (deformation) is caused in the direction (z-axis direction) perpendicular to the rotation axis (x-axis) and to the vibration direction (y-axis) due to the Coriolis force. The signal (voltage) generated by the deformation is extracted by detection electrodes 17 as explained above. The larger the angular velocity, the larger the Coriolis force (consequently the voltage of the signal detected). Therefore, the angular velocity is detected.

As described above, the angular velocity sensor 51 has the piezoelectric body 3, drive circuit 103, and detection circuit 105. The piezoelectric body 3 has the frame 5, the pair of drive arms 7, and the detection arm 9. The frame 5 is supported in the pair of supported parts 5a spaced apart from each other in the x-axis direction. The pair of drive arms 7 extend alongside each other from the frame 5 in the y-axis direction at positions between the pair of supported parts 5a and are spaced apart from each other. The detection arm 9 extends from the frame 5 in the y-axis direction at a position between the pair of drive arms 7 in the x-axis direction. The drive circuit 103 applies voltages of mutually reverse phases to the pair of drive arms 7 so that the pair of drive arms 7 vibrate bending to mutually reverse sides in the x-axis direction and vibrate. The detection circuit 105 detects the signals generated due to the bending deformation in the z-axis direction or x-axis direction (z-axis direction in the present embodiment) of the detection arm 9.

From another viewpoint, the sensor element 1 has the piezoelectric body 3, the plurality of excitation electrodes 15, the plurality of detection electrodes 17, the plurality of pads 13, and the plurality of wirings 19. The piezoelectric body 3 has the frame 5, the pair of drive arms 7, and the detection arm 9. The pair of drive arms 7 extend alongside each other from the frame 5 in the y-axis direction at positions spaced apart from each other in the x-axis direction. The detection arm 9 extends from the frame 5 in the y-axis direction at a position between the pair of drive arms 7 in the x-axis direction. The plurality of excitation electrodes 15 are provided in an arrangement capable of applying voltages exciting the pair of drive arms 7 in the x-axis direction. The plurality of detection electrodes 17 are provided in an arrangement capable of detecting the signals generated by the vibration in the z-axis direction or x-axis direction (z-axis direction in the present embodiment) of the detection arm 9. The plurality of pads 13 are provided on the piezoelectric body 3 at positions which are closer to the two sides of the x-axis direction than the pair of drive arms 7. The plurality of wirings 19 connect the plurality of excitation electrodes 15 so that voltages of mutually reverse phases are applied from the plurality of excitation electrodes 15 to the pair of drive arms 7 so that the pair of drive arms 7 vibrate bending to mutually reverse sides in the x-axis direction.

Accordingly, detection according to a new mode of vibration becomes possible so that the frame 5 bends (vibrates) according to the excitations of the pair of drive arms 7, the detection arm 9 is displaced (vibrates), and the angular velocity is detected due to the Coriolis force acting upon this detection arm 9 being displaced.

As a comparative example, for example, there can be mentioned one making the Coriolis force act on the drive arms being excited, thereby vibrating them, and transferring this vibration according to the Coriolis force to the detection arm. In the present embodiment, unlike such a comparative example, the Coriolis force directly acts upon the detection arm. As a result, for example the detection sensitivity is improved.

Further, as a comparative example, for example, there can be mentioned an embodiment where the detection arm is deformed bending (vibrating) in the same direction as the vibration direction (x-axis direction) of the drive arms, and the Coriolis force is made act upon this vibrating detection arm. The present embodiment is different from such an embodiment in the vibration direction of the detection arm, and it becomes possible to detect the angular velocity for the rotation axis (x-axis) for which the angular velocity could not be detected in the comparative example explained before.

Further, in the present embodiment, the detection arm 9 is positioned at the center between the pair of drive arms 7.

The bending deformation of the frame 5 is apt to become larger at the center between the pair of drive arms 7. By positioning the detection arm 9 at such a position, it is possible to make the amplitude of the detection arm 9 larger and make the detection sensitivity larger. In particular, in a case where the pair of drive arms 7 and one supported part 5a are linearly symmetrical relative to the same symmetrical axis, the amplitude of the detection arm 9 can be made largest. Note that, in the art referred to above as a comparative example in which the detection arm was made to deform to bend (vibrate) in the vibration direction of the drive arms, and the Coriolis force was made act upon that vibrating detection arm, in principle thereof, for example, a pair of detection arms are arranged linearly symmetrically relative to the center between the pair of drive arms, or one drive arm and one detection arm are arranged like a tuning-fork.

Further, in the present embodiment, the piezoelectric body 3 has only a pair of drive arms 7 as arms which extend from the frame 5, are applied with voltages, and vibrate (as will be explained later, it is also possible to provide another drive arm 7 which extends aligned relative to the pair of drive arms 7). That is, another drive arm which extends from the frame 5 toward the side opposite to the drive arms 7 (in the example shown, the negative side of the y-axis direction) is not provided.

Accordingly, for example, the frame 5 can be reliably made to deform to bend by the pair of drive arms 7. Note that, in the comparative example in which the detection arm is positioned at the center of the pair of drive arms (see Patent Literature 1), for example, provision is made of another pair of drive arms extending toward the opposite side to the pair of drive arms, and the other pair of drive arms are excited with the same phase as that for the pair of drive arms so as not to cause bending as in the present embodiment in the base part corresponding to the frame 5.

Second Embodiment (Configuration of Angular Velocity Sensor)

Figure 4A:
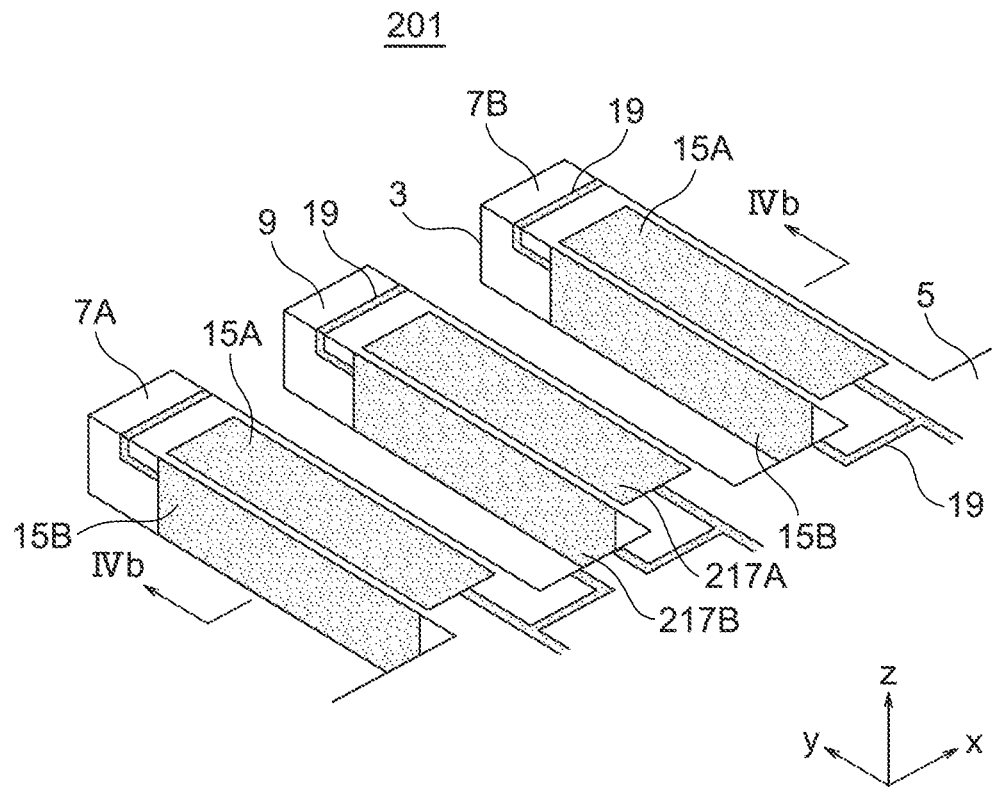
FIG. 4A is a perspective view showing a portion of a sensor element according to a second embodiment in an enlarged manner.
Figure 4B:
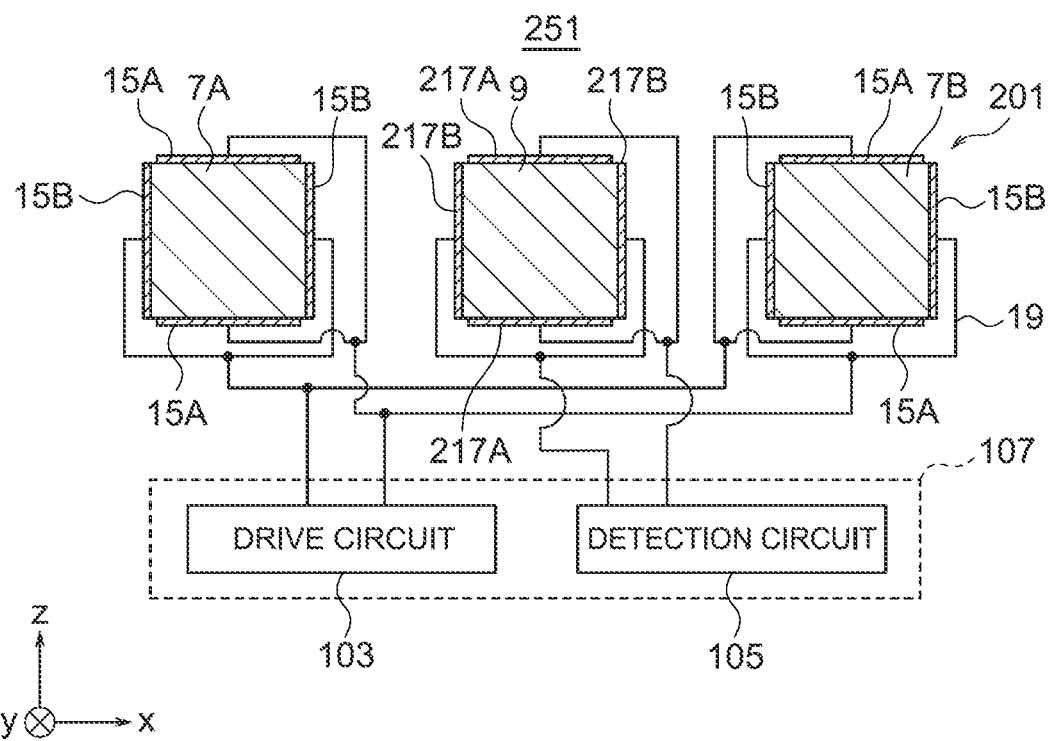
FIG. 4B is a cross-sectional view taken along the IVb-IVb line in FIG. 4A.

FIG. 4A is a perspective view the same as FIG. 2A showing a portion of a sensor element 201 according to a second embodiment in an enlarged manner. FIG. 4B is a view the same as FIG. 2B showing an angular velocity sensor 251 according to the second embodiment and includes a cross-sectional view corresponding to the IVb-IVb line in FIG. 4A.

The angular velocity sensor 251 according to the second embodiment, in the same way as the angular velocity sensor 51 according to the first embodiment, makes the pair of drive arms 7 vibrate in the x-axis direction to thereby make the frame 5 bend (vibrate), whereby in turn the detection arm 9 is displaced (vibrates) in the y-axis direction. Further, the Coriolis force is made to directly act upon the detection arm 9. However, in contrast to the angular velocity sensor 51 detecting the rotation around the x-axis, the angular velocity sensor 251 is formed to detect the rotation around the z-axis. Specifically, this is as follows.

The sensor element 201 has a piezoelectric body 3, a plurality of excitation electrodes 15, a plurality of detection electrodes 217, a plurality of pads 13 (not shown here), and a plurality of wirings 19. As understood from these notations, except for the plurality of detection electrodes 217 (and the wirings 19 concerned with them), the fundamental configuration of the sensor element 201 may be made substantially the same as the sensor element 1 in the first embodiment. FIG. 1 may be grasped as a perspective view showing the sensor element 201.

Note that, in the present embodiment, unlike the first embodiment, it is intended that the detection arm 9 vibrate in the x-axis direction due to the Coriolis force. Due to such a difference, various dimensions may be different from those in the first embodiment.

For example, in the detection arm 9, the larger the width thereof (x-axis direction), the higher the natural frequency in the vibration direction (x-axis direction). Then, the larger the length thereof (from another viewpoint, mass), the lower the natural frequency in the vibration direction. The various dimensions of the detection arm 9 are for example set so that the natural frequency in the vibration direction of the detection arm 9 becomes closer to the natural frequency in the drive arm 7 in the excitation direction. For example, the width and length of the detection arm 9 are the same as the width and length of the drive arm 7. Note that, the dimensions of the two may be different.

The detection electrodes 217A and 217B are ones extracting the signals generated due to the bending deformation of the detection arm 9 in the x-axis direction. Therefore, for example, they are given the same configurations as those of the excitation electrodes 15A and 15B for exciting the drive arms 7 in the x-axis direction. Accordingly, the explanation for the excitation electrodes 15 in the first embodiment may be used as the explanation for the detection electrodes 217 by replacing the excitation electrodes 15 by the detection electrodes 217. The same is true also for the mutual connection of the pair of detection electrodes 217A and the mutual connection of the pair of detection electrodes 217B.

The first embodiment, reference was made to the effect that a slit penetrating from the upper surface to the lower surface may be provided in the detection arm 9. In the second embodiment, in the same way as the drive arms 7, the detection arm 9 may be provided with a recessed groove in the upper surface and/or lower surface thereof.

(Operation of Angular Velocity Sensor)

The excitation of the piezoelectric body 3 in the second embodiment is the same as that in the first embodiment. FIG. 3A and FIG. 3B may be grasped as the views showing the excitation states of the piezoelectric body 3 in the second embodiment. Accordingly, the pair of drive arms 7 vibrate so as to mutually approach or be separated in the x-axis direction, and the detection arm 9 is displaced (vibrates) in the y-axis direction.

FIG. 5A and FIG. 5B are schematic plan views for explaining the vibration of the detection arm 9 due to the Coriolis force. FIG. 5A and FIG. 5B correspond to the states in FIG. 3A and FIG. 3B.

When the sensor element 1 is rotated around the z-axis in the state where the piezoelectric body 3 is vibrating as explained with reference to FIG. 3A and FIG. 3B, since the detection arm 9 is vibrating (is being displaced) in the y-axis direction, it vibrates (is deformed) in the direction (x-axis direction) perpendicular to the rotation axis (z-axis) and to the vibration direction (y-axis) due to the Coriolis force.

As described above, in the present embodiment as well, the frame 5 is supported at the pair of supported parts 5a which are spaced apart from each other in the x-axis direction (from another viewpoint, the plurality of pads 13 are provided closer to the two sides of the x-axis direction than the pair of drive arms 7), the drive arms 7 extend alongside each other from the frame 5 in the y-axis direction at positions between the pair of supported parts 5a and are spaced apart from each other in the x-axis direction, the detection arm 9 extends from the frame 5 in the y-axis direction at a position between the pair of drive arms 7 in the x-axis direction, the drive circuit 103 applies voltages of mutually reverse phases to the pair of drive arms 7 so that the pair of drive arms 7 vibrate bending to the mutually reverse sides in the x-axis direction (the plurality of excitation electrodes 15 are arranged so that such a voltage application is possible), and the detection circuit 105 detects the signals generated due to the bending deformation in a suitable direction (x-axis direction in the present embodiment) of the detection arm 9 (the plurality of detection electrodes 217 are arranged so that such detection is possible).

Accordingly, the same effects as those by the first embodiment are obtained. For example, detection according to a new mode of vibration becomes possible. Further, for example the Coriolis force acts directly upon the detection arm, therefore an improvement of detection sensitivity can be expected. Further, for example, it becomes possible to detect the angular velocity about the axis (z-axis) for which the angular velocity could not be detected in the comparative example in which the detection arm was made to deform to bend (vibrate) in the same direction as the vibration direction (x-axis direction) of the drive arms and the Coriolis force was made act upon this vibrating detection arm.

Third and Fourth Embodiments

As understood from the first and second embodiments, in the present disclosure, when comparing the angular velocity sensor detecting the rotation around the x-axis and the angular velocity sensor detecting the rotation around the z-axis, basically, in the configurations thereof, only the configurations of the detection electrodes 17 and 217 (and the wirings 19 concerned with them) are different. In the modes of operation of them, only the directions in which the Coriolis force acts are different. Therefore, in the following description, sometimes the angular velocity sensor detecting the rotation around the x-axis and the angular velocity sensor detecting the rotation around the z-axis will be explained together, and the notations of both will be attached to the same drawings.

(Configuration of Angular Velocity Sensor)

Figure 6A:
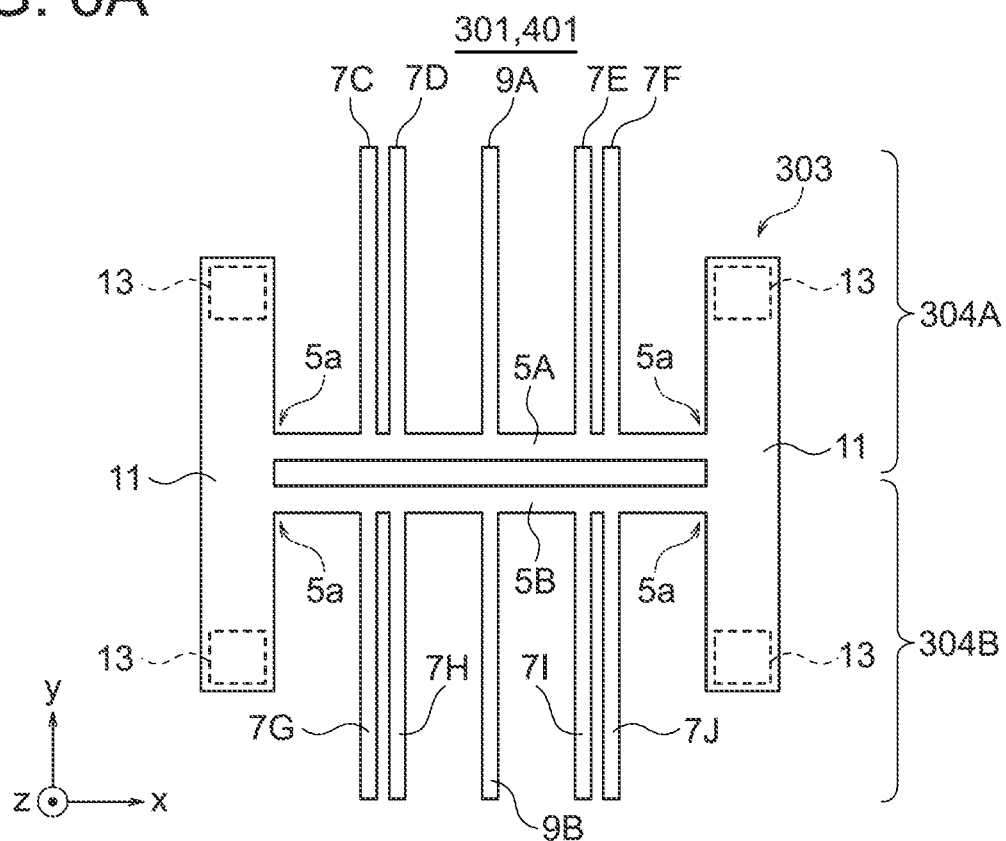
FIG. 6A is a plan view showing the configuration of a sensor element according to a third or fourth embodiment.

FIG. 6A is a plan view showing the configuration of a sensor element 301 according to a third embodiment or a sensor element 401 according to a fourth embodiment.

The piezoelectric body 303 in the sensor element 301 or 401 is shaped comprised of two piezoelectric bodies 3 in the first and second embodiments combined. That is, the piezoelectric body 3 has two units 304A and 304B, each unit 304 has a frame 5 and at least one pair of (two pairs in the present embodiment) drive arms 7 and the detection arm 9 all extending alongside each other from the frame 5 in the y-axis direction. The two units 304 are arranged so that the sides opposite to the extension direction of the drive arms 7 and detection arm 9 are made to face each other and are supported by a common pair of mounting parts 11. The distance between the two units 304 may be suitably set so that for example the frames 5A and 5B do not contact each other. The two units 304 for example have the same shapes and sizes (shapes and sizes linearly symmetrical relative to a not shown symmetrical axis parallel to the x-axis).

Further, the piezoelectric body 3 in the first embodiment had one pair of drive arms 7 with respect to one frame 5. However, the unit 304 in the piezoelectric body 303 has two pairs of drive arms 7 with respect to one frame 5. As will be explained later (FIG. 6B and FIG. 6C), the two drive arms 7 which are adjacent to each other (two of 7C and 7D, two of 7E and 7F, two of 7G and 7H, and two of 7I and 7J) are applied with voltages with the same phase so that the two bend together to mutually the same sides in the x-axis direction. Accordingly, the two drive arms 7 which are adjacent to each other may be grasped as corresponding to the one drive arm 7 in the first embodiment. By dividing the drive arm 7 in the first embodiment into two arms in this way, for example, the mass of the entire drive arm 7 can be secured even if the length of the drive arm 7 is made shorter and consequently reduction of size and improvement of detection sensitivity can both be realized.

The position of the center between the mutually adjoining two drive arms 7 (or the position of each drive arm 7) may be made the same as the position of the drive arm 7 explained in the first embodiment. The distance between the mutually adjoining two drive arms may be suitably set. The shapes and dimensions of the mutually adjoining two drive arms 7 are for example the same as each other. Note that, they may differ from each other as well. The piezoelectric body 303 is for example a linearly symmetrical shape relative to a not shown symmetrical axis (detection arm 9). The shapes and arrangements of the plurality of drive arms 7 are also linearly symmetrical.

Note that, a larger number of drive arms 7 than the two pairs may be provided with respect to one frame as well. Further, a configuration providing two or more pairs of drive arms 7 with respect to one frame (configuration dividing one drive arm 7 into two or more) may be applied not only to the first or second embodiment (piezoelectric body 3), but also to the other embodiments as well.

The sensor element 301 detecting rotation around the x-axis (third embodiment) corresponds to two sensor elements 1 (first embodiment) combined, therefore the configurations and connection relationships of the excitation electrodes 15 and the detection electrodes 17 in each unit 304 in the sensor element 301 may be the same as those in the sensor element 1. In the same way, the sensor element 401 detecting rotation around the z-axis (fourth embodiment) corresponds two sensor elements 201 (second embodiment) combined, therefore the configurations and connection relationships of the excitation electrodes 15 and the detection electrodes 217 in each unit 304 in the sensor element 401 may be the same as those in the sensor element 201.

The two drive arms 7 neighboring each other correspond to one drive arm 7 in the first embodiment and are applied with voltages with mutually the same phases. Therefore, between these two drive arms 7, the excitation electrodes 15A are given the same potential (for example the excitation electrodes 15A are mutually connected by the wiring 19), and the excitation electrodes 15B are given the same potential (for example the excitation electrodes 15B are mutually connected by the wiring 19).

The connection relationships of the excitation electrodes 15 and the detection electrodes 17 (or 217) between the units 304 will be explained at the following explanation of the operation.

(Operation of Angular Velocity Sensor)

Figure 6B:
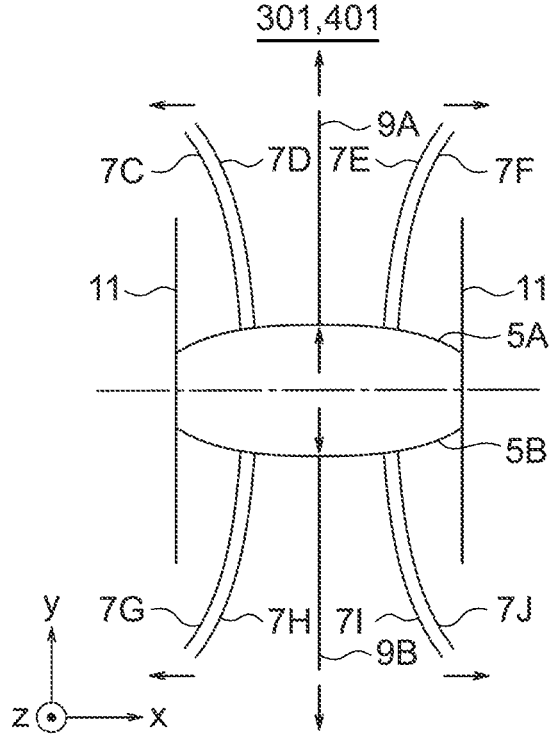
FIG. 6B and FIG. 6C are schematic views for explaining the mode of operation of the sensor element in FIG. 6A.
Figure 6C:
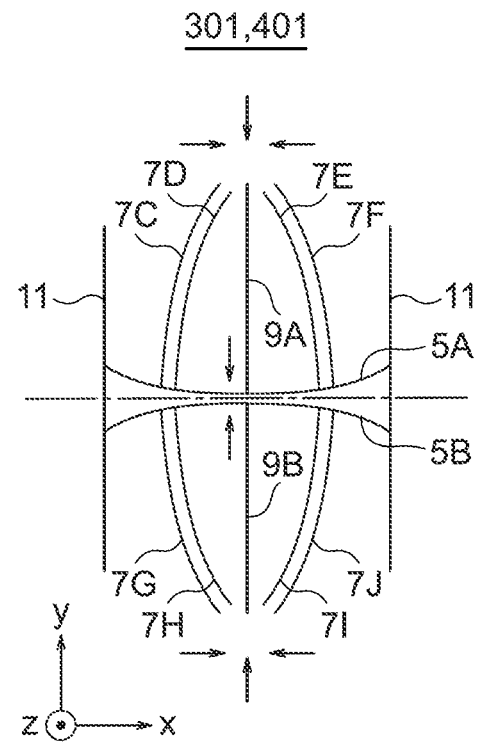

FIG. 6B and FIG. 6C are schematic plan views showing excitation states of the piezoelectric body 303 in the third or fourth embodiment and correspond to FIG. 3A and FIG. 3B in the first embodiment.

The excitation in each unit 304 is basically the same as the excitation of the piezoelectric body 3 in the first embodiment. However, in each unit 304, the mutually adjoining two drive arms 7 are applied with voltages with the same phases so as to bend together to the same sides as each other, so correspond to one drive arm 7 in the piezoelectric body 3.

Between the two units 304, for example, voltages with the same phases are applied so that the drive arms 7 which are positioned on the same side (positive side or negative side) in the x-axis direction relative to the detection arms 9 bend to the same side in the x-axis direction. Accordingly, the frames 5A and 5B warp to mutually reverse directions. Further, the detection arms 9A and 9B are displaced to mutually reverse directions.

For application of voltages as described above, for example, in the drive arms 7 positioned on the same side in the x-axis direction relative to the detection arms 9 (7C, 7D, 7G and 7H, or 7E, 7F, 7I and 7J), the excitation electrodes 15A are given the same potentials as each other, and the excitation electrodes 15B are given the same potentials as each other. The excitation electrodes 15 which should become the same potential are for example mutually connected by the plurality of wirings 19. Further, all excitation electrodes 15 are connected through two among the four pads 13 to the drive circuit 103.

Figure 7A:
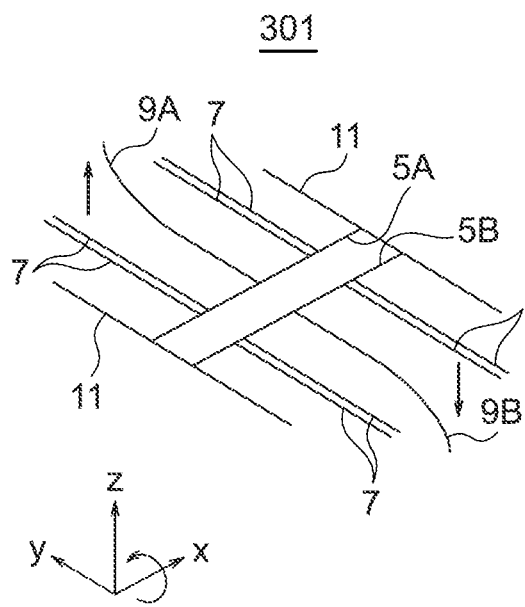
FIG. 7A, FIG. 7B, FIG. 7C, and FIG. 7D are schematic views for explaining the mode of operation of the sensor element in FIG. 6A.
Figure 7B:
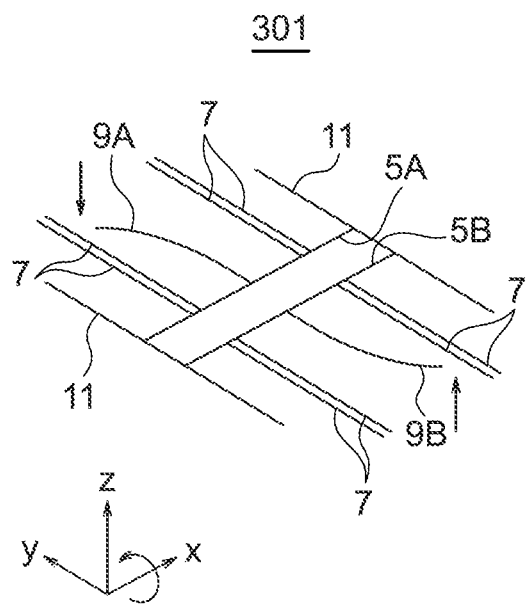

FIG. 7A and FIG. 7B are schematic perspective views for explaining vibrations of the detection arms 9 according to the Coriolis force in the sensor element 301 according to the third embodiment detecting the rotation around the x-axis. FIG. 7A and FIG. 7B correspond to the states in FIG. 6B and FIG. 6C.

When the sensor element 301 is rotated around the x-axis in the state where the piezoelectric body 303 is vibrating as explained with reference to FIG. 6B and FIG. 6C, in each unit 304, in the same way as the first embodiment, the detection arm 9 vibrates in the z-axis direction due to the Coriolis force. At this time, the detection arms 9A and 9B are vibrating with phases causing displacements to mutually reverse sides in the y-axis direction, therefore they receive the Coriolis force on the same side relative to the rotation direction around the x-axis direction. From another viewpoint, the detection arms 9A and 9B vibrate so as to bend to mutually reverse sides in the z-axis direction.

In order to add the signals generated in such detection arms 9A and 9B, for example, the detection electrode 17A in the detection arm 9A and the detection electrode 17B in the detection arm 9B are connected, and the detection electrode 17B in the detection arm 9A and the detection electrode 17A in the detection arm 9B are connected. The connections are for example achieved by the plurality of wirings 19. Further, all detection electrodes 17 are connected through two among the four pads 13 to the detection circuit 105.

Figure 7C:
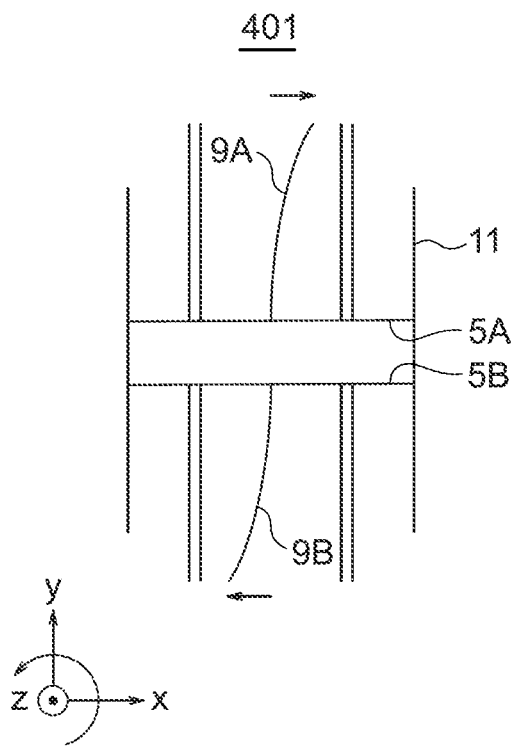
Figure 7D:
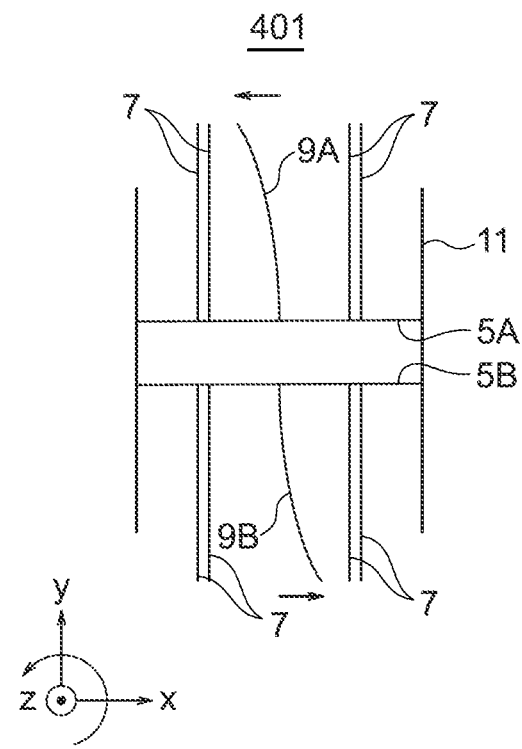

FIG. 7C and FIG. 7D are schematic plan views for explaining the vibrations of the detection arms 9 due to the Coriolis force in the sensor element 401 according to the fourth embodiment for detecting the rotation around the z-axis. FIG. 7C and FIG. 7D correspond to the states in FIG. 6B and FIG. 6C.

When the sensor element 401 is rotated around the z-axis in the state where the piezoelectric body 303 vibrates as explained with reference to FIG. 6B and FIG. 6C, in each unit 304, in the same way as the second embodiment, the detection arms 9 vibrate in the x-axis direction according to the Coriolis force. At this time, the detection arms 9A and 9B are vibrating with phases causing displacements to mutually reverse sides in the y-axis direction, therefore receive the Coriolis force on the same side relative to the rotation direction around the z-axis. From another viewpoint, the detection arms 9A and 9B vibrate so as to bend to mutually reverse sides in the x-axis direction.

In order to add the signals generated in such detection arms 9A and 9B, for example, the detection electrode 217A in the detection arm 9A and the detection electrode 217B in the detection arm 9B are connected, and the detection electrode 217B in the detection arm 9A and the detection electrode 217A in the detection arm 9B are connected. The connections are for example achieved by the plurality of wirings 19. Further, all detection electrodes 217 are connected through two among the four pads 13 to the detection circuit 105.

As described above, the angular velocity sensor or sensor element in the third or fourth embodiment includes an angular velocity sensor or sensor element in the first or second embodiment, therefore the same effects as those by the angular velocity sensor or sensor element in the first or second embodiment are obtained. For example, detection according to a new mode of vibration becomes possible.

Further, in the third and fourth embodiments, the piezoelectric body 303 has two combinations of parts each consisting of the frame 5, (at least) one pair of drive arms 7, and the detection arm 9 so that the sides of the frames 5 opposite to the sides from each of which the pair of drive arms 7 extend face each other (has two units 304).

Accordingly, for example, by adding the signals detected in the two detection arms 9, the detection sensitivity can be improved. Further, for example, in the first embodiment, the region which is positioned between the pair of mounting parts 11 and on the negative side of the y-axis direction becomes a dead space. However, such a space is effectively utilized. As a result, improvement of sensitivity and reduction of size are both achieved.

Modification of Third and Fourth Embodiments

In the third and fourth embodiments, between the two units 304, the drive arms 7 were excited with the same phase, and the detection arms 9 vibrated so as to be displaced to mutually reverse sides in the y-axis direction. Although not particularly shown, conversely to these embodiments, between the two units 304, the drive arms 7 may be excited with reverse phases, and the detection arms 9 may vibrate so as to be displaced to mutually the same sides in the y-axis direction.

In this case, the connections of the excitation electrodes 15 and detection electrodes 17 between the two units 304 become reverse to those in the third and fourth embodiments. For example, between the drive arms 7 which are positioned on the same side in the x-axis direction, the plurality of wirings 19 connect the excitation electrode 15A in the unit 304A and the excitation electrode 15B in the unit 304B and connect the excitation electrode 15B in the unit 304A and the excitation electrode 15A in the unit 304B. Further, between the two detection arms 9A and 9B, the detection electrodes 17A are mutually connected, and the detection electrodes 17B are mutually connected. The point that all excitation electrodes 15 are connected through two among the four pads 13 to the drive circuit 103 and all detection electrodes 17 are connected through the other two among the four pads 13 to the detection circuit 105 is the same as in the third and fourth embodiments.

In the case where the two frames 5 are made to warp to mutually reverse sides in the y-axis direction as in the third and fourth embodiments, for example, forces that move the entireties of the units 304 in the y-axis direction are cancelled out by each other between the two units 304 through the pair of mounting parts 11, therefore generation of unwanted vibration is suppressed. Further, for example, the moments are transferred from the two frames 5 to the mounting parts 11 so as to make the mounting parts 11 warp, and these moments from the two frames 5 act so as to make the mounting parts 11 warp to the same sides as each other. Accordingly, increase of displacements of the detection arms 9 can be expected due to the bending of the mounting parts 11 although depending upon the widths of the mounting parts 11 and distance between the two frames 5 and the like.

On the other hand, in the case where the two frames 5 are made to warp to the same sides as each other in the y-axis direction as in the modification explained above, for example, the two frames 5 maintain a substantially constant distance between them. From another viewpoint, the probability of the two frames 5 approaching each other as shown in FIG. 6C is reduced, and consequently the probability of unintended interaction is reduced.

In the third and fourth embodiments and the modification described above, the two units 304 were excited by the same frequency. However, the two units 304 are basically structured so that they can independently vibrate, therefore they may be excited by frequencies different from each other as well.

Further, in the third and fourth embodiments and modification described above, the two units 304 were utilized for detection of the angular velocities around rotation axes the same as each other (x-axis or z-axis). However, the two units 304 are basically structured so that they can independently vibrate, therefore they may be utilized for detection around rotation axes different from each other as well. For example, one of the two units 304 may be utilized for the detection of the angular velocity around the x-axis, and the other of the two units 304 may be utilized for the detection of the angular velocity around the z-axis. In other words, one of the two units 304 may be provided with the detection electrode 17 in the first embodiment, and the other of the two units 304 may be provided with the detection electrode 217 in the second embodiment.

In the case where the excitation frequencies and/or rotation axes of detection object are different between the two units 304 as described above, the two units 304 may be different from each other in dimensions etc. as well. Note that, where the excitation frequencies and/or rotation axes of detection object are different between the two units 304, eight pads in total of the four pads 13 corresponding to one unit 304 and the four pads 13 corresponding to the other unit 304 are necessary.

The modification according to the vibrations of the above two units 304 may be applied to not only the third and fourth embodiments, but also the other embodiments each having two units (fifth, sixth, ninth, and 10th embodiments which will be explained later) as well.

Fifth and Sixth Embodiments

Figure 8A:
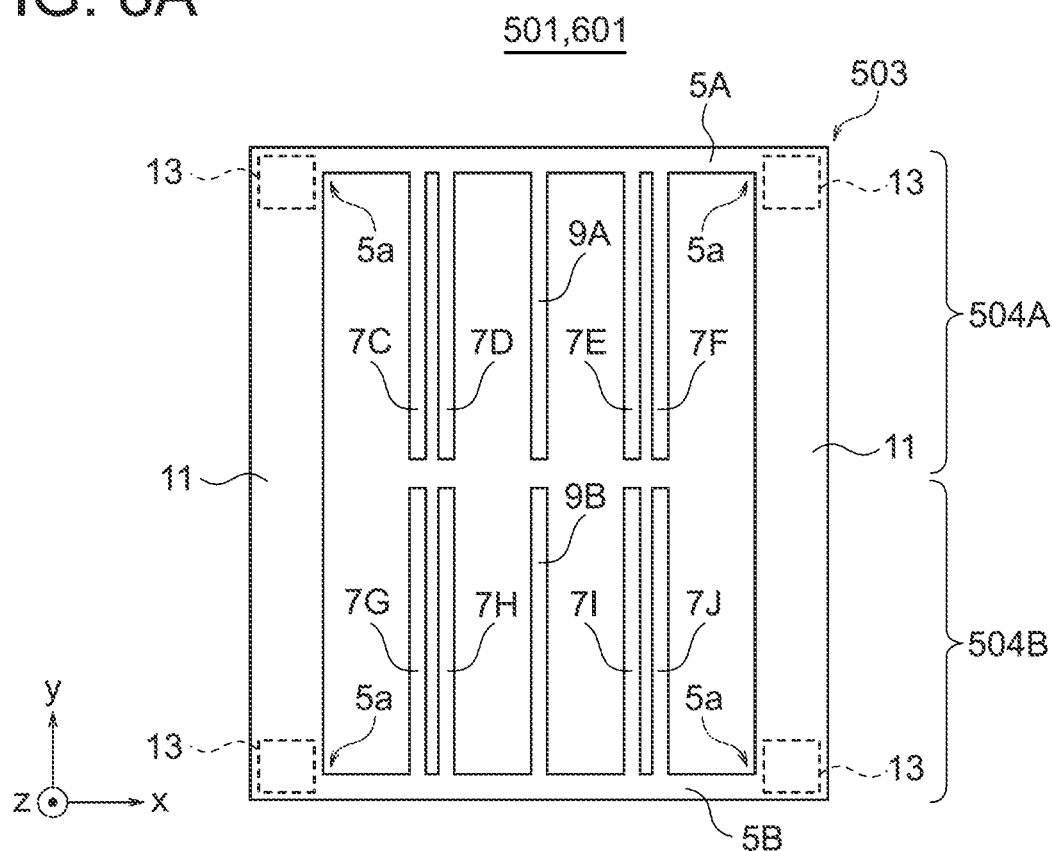
FIG. 8A is a plan view showing the configuration of a sensor element according to a fifth or sixth embodiment.
Figure 8B:
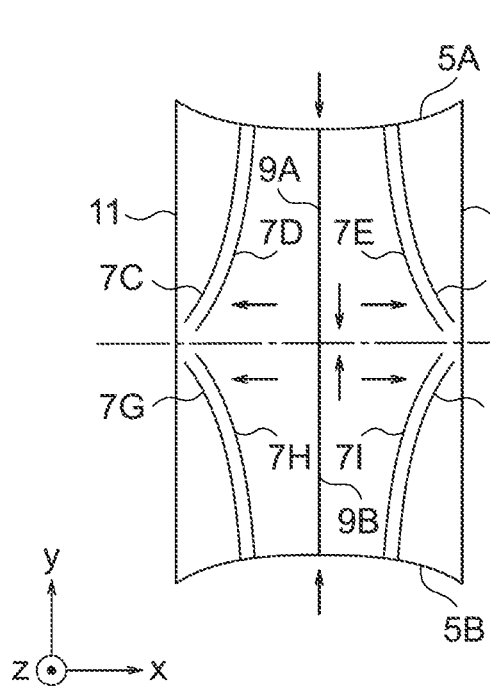
FIG. 8B and FIG. 8C are schematic views for explaining the mode of operation of the sensor element in FIG. 8A.
Figure 8C:
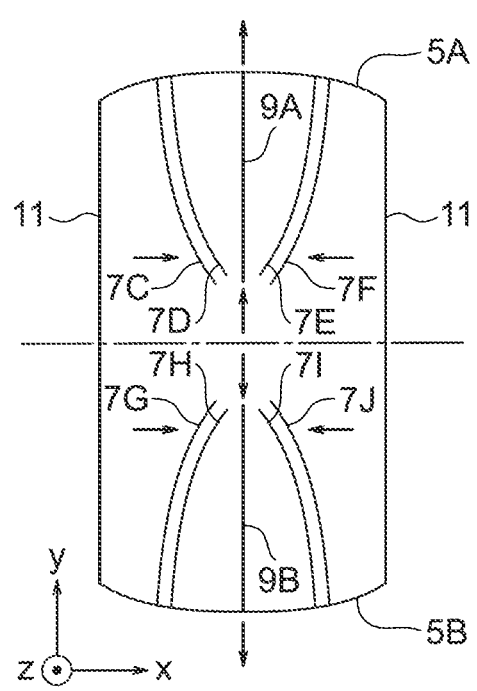

FIG. 8A to FIG. 8C are plan views showing a sensor element 501 according to a fifth embodiment or a sensor element 601 according to a sixth embodiment and are views corresponding to FIG. 6A to FIG. 6C according to the third or fourth embodiment.

A piezoelectric body 503 according to the fifth or sixth embodiment, in the same way as the piezoelectric body 303 according to the third or fourth embodiment, has two combinations of parts (units 504A and 504B) each consisting of a frame 5, (at least) one pair of drive arms 7, and a detection arm 9. However, the two units 504 in the fifth or sixth embodiment, conversely to the two units 304 in the third or fourth embodiment, are arranged making the extended sides of the drive arms 7 and detection arms 9 face each other. Along with this, the two frames 5 are for example connected to the mounting parts 11 having the y-axis direction as the long directions in the end parts of the mounting parts 11.

As will be understood from a comparison between FIG. 8A to FIG. 8C and FIG. 6A to FIG. 6C, the fifth or sixth embodiment can be grasped as an embodiment making the orientations in the y-axis direction of the units 304 reverse (or making the positions in the y-axis direction of the two units 304 reverse to each other). Accordingly, in each unit 504, the configurations of the frame 5, drive arms 7, detection arm 9, excitation electrodes 15, and detection electrodes 17 or 217 may be the same as those in the first to fourth embodiments. Further, between the two units 504, the mutual connection of the excitation electrodes 15 and mutual connection of the detection electrodes 17 or 217 may be the same as those in the third or fourth embodiment. Also, the operation thereof can be easily deduced from the first to fourth embodiments, so explanation will be omitted.

Note that, the positions of the pads 13, in the same way as the first to fourth embodiments, may be respectively provided at the two ends of the pair of mounting parts 11 in the y-axis direction (example shown) or may be provided on the sides closer to the center of the y-axis direction than the connection positions of the pair of mounting parts 11 and the pair of frames 5. In the former case, for example support of the sensor element 501 or 601 becomes stabler, and parallelism of mounting can be improved. In the latter case, for example, in a case where also the bending of the mounting parts 11 are utilized for displacement of the detection arms 9, it becomes easier to make the mounting parts 11 bend.

Seventh and Eighth Embodiments (Configuration of Angular Velocity Sensor)

Figure 9A:
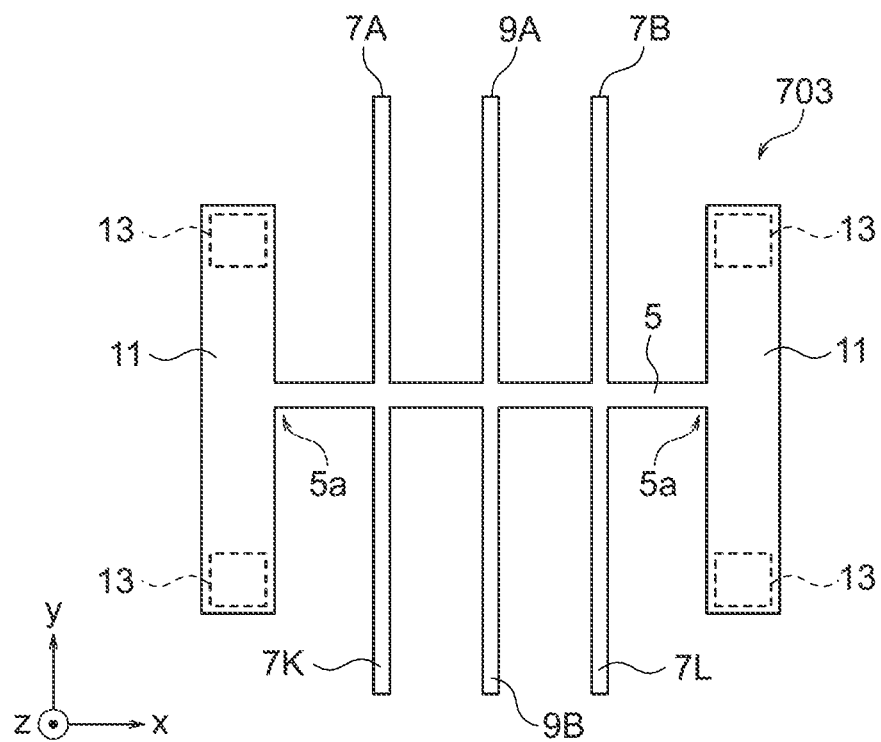
FIG. 9A is a plan view showing the configuration of a sensor element according to a seventh or eighth embodiment.

FIG. 9A is a plan view showing the configuration of a sensor element 701 according to a seventh embodiment or a sensor element 801 according to an eighth embodiment.

In a piezoelectric body 703 according to the sensor element 701 or 801, in the same way as the piezoelectric body 303 according to the third or fourth embodiment, the drive arms 7 and detection arm 9 extend toward the two sides of the y-axis direction. Note that, in contrast to the piezoelectric body 303 in which the drive arms 7 and detection arm 9 extend from the two frames 5 toward the two sides of the y-axis direction, in the piezoelectric body 703, the drive arms 7 and detection arms 9 extend from one frame 5 toward the two sides of the y-axis direction.

The piezoelectric body 703 is for example linearly symmetrically shaped relative to a not shown symmetrical axis parallel to the x-axis. Accordingly, for example, a pair of drive arms 7A and 7B and a detection arm 9A extending toward the positive side of the y-axis direction and a pair of drive arms 7K and 7L and a detection arm 9B extending toward the negative side of the y-axis direction have the mutually same shapes and dimensions and have equivalent vibration characteristics.

As will be explained later, when focusing on only the frame 5 and the drive arms 7 and detection arm 9 on the positive side of the y-axis direction, the operations thereof are basically the same as those in the first or second embodiment. The same is true also for the case focusing on only the frame 5 and the drive arms 7 and detection arm 9 on the negative side of the y-axis direction. Accordingly, in the sensor element 701 detecting the rotation around the x-axis (seventh embodiment), the configurations and connection relationships of the excitation electrodes 15 and detection electrodes 17 when focusing on only the positive side or negative side of the y-axis direction may be the same as those in the sensor element 1 (first embodiment). In the same way, in the sensor element 801 detecting the rotation around the z-axis (eighth embodiment), the configurations and connection relationships of the excitation electrodes 15 and detection electrodes 217 when focusing on only the positive or negative side of the y-axis direction may be the same as those in the sensor element 201 (second embodiment).

The connection relationships of the excitation electrodes 15 and detection electrodes 17 (or 217) between the positive side and the negative side of the y-axis direction will be explained at the following explanation of operation.

(Operation of Angular Velocity Sensor)

Figure 9B:
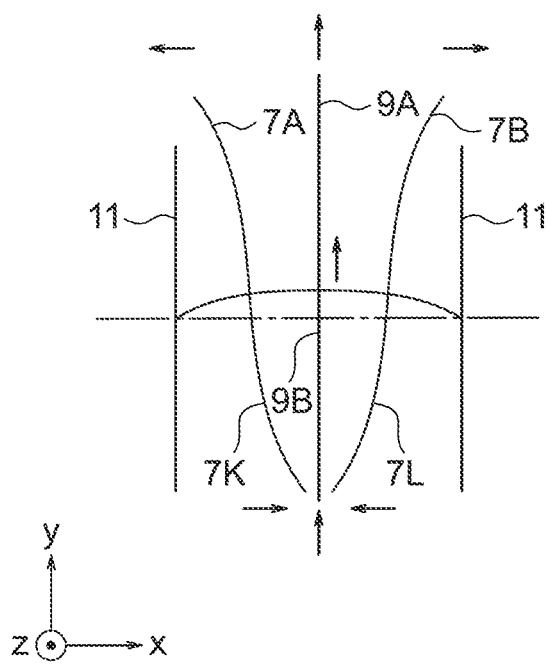
FIG. 9B and FIG. 9C are schematic views for explaining the mode of operation of the sensor element in FIG. 9A.
Figure 9C:
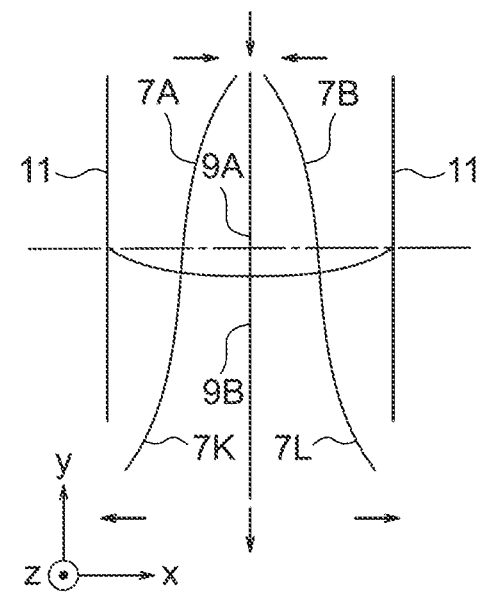

FIG. 9B and FIG. 9C are schematic plan views showing excitation states of the piezoelectric body 703 in the seventh or eighth embodiment and correspond to FIG. 3A and FIG. 3B in the first embodiment.

In the excitation of the piezoelectric body 703, the operations when focusing on the frame 5 and the drive arms 7 on one side (positive side or negative side) of the y-axis direction are the same as those in the first to sixth embodiments. On the other hand, when focusing on the drive arms 7 and detection arms 9 on the two sides of the y-axis direction, conversely to the third to sixth embodiments, the drive arms 7 which are positioned on the same side in the x-axis direction relative to the detection arms 9 are applied with voltages with reverse phases so that they bend to mutually reverse sides in the x-axis direction. As a result, a moment of bending of the frame 5 by the drive arms 7A and 7B on the positive side of the y-axis direction and a moment of bending of the frame 5 by the drive arms 7K and 7L on the negative side of the y-axis direction are superimposed. Further, the two detection arms 9 vibrate so as to be displaced together to the same side in the y-axis direction.

For the voltage application as described above, for example, between the drive arms 7 positioned on the same side in the x-axis direction (7A and 7K, or 7B and 7L), the excitation electrode 15A and the excitation electrode 15B are made the same potential. That is, when indicating this by only notations of the drive arms 7 and excitation electrodes 15, 7A and 15A, 7B and 15B, 7K and 15B, and 7L and 15A respectively have the same potential, and 7A and 15B, 7B and 15A, 7K and 15A, and 7L and 15B respectively have the same potential. The excitation electrodes 15 which should become the same potential are for example mutually connected by the plurality of wirings 19. Further, all excitation electrodes 15 are connected through two among the four pads 13 to the drive circuit 103.

Figure 10A:
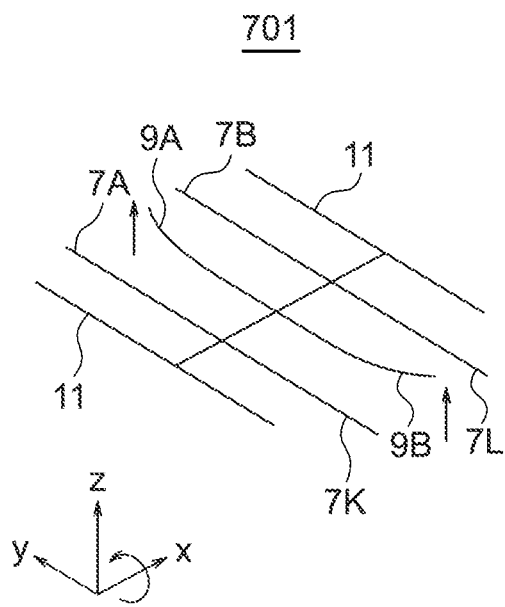
FIG. 10A, FIG. 10B, FIG. 10C, and FIG. 10D are schematic views for explaining the mode of operation of the sensor element in FIG. 9A.
Figure 10B:
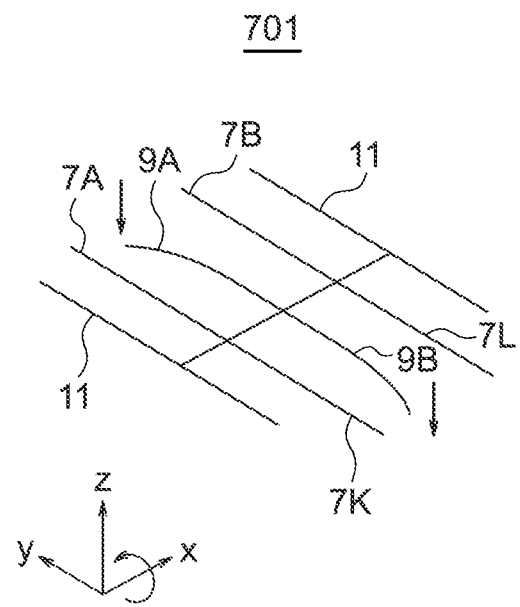

FIG. 10A and FIG. 10B are schematic perspective views for explaining vibrations of the detection arms 9 due to the Coriolis force in the sensor element 701 according to the seventh embodiment for detecting rotation around the x-axis. FIG. 10A and FIG. 10B correspond to the states in FIG. 9B and FIG. 9C.

As explained with reference to FIG. 9B and FIG. 9C, in the piezoelectric body 703, conversely to the piezoelectric body 303 according to the third embodiment, the two detection arms 9 vibrate with phases whereby they are displaced to mutually the same sides in the y-axis direction. Accordingly, when the sensor element 701 is rotated around the x-axis in the state where the two detection arms 9 are vibrating, conversely to the third embodiment, the two detection arms 9 receive the Coriolis force on the reverse sides relative to the rotation direction around the x-axis. From another viewpoint, the detection arms 9A and 9B vibrate so as to bend to mutually the same sides in the z-axis direction.

In order to add the signals generated in such detection arms 9A and 9B, for example, between the detection arms 9A and 9B, the detection electrodes 17A are mutually connected and the detection electrodes 17B are mutually connected. The connections are made by for example the plurality of wirings 19. Further, all detection electrodes 17 are connected through two among the four pads 13 to the detection circuit 105.

Figure 10C:
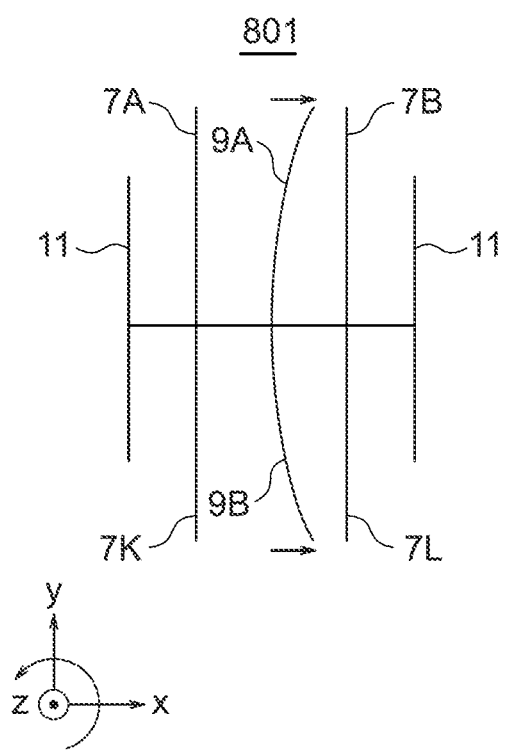
Figure 10D:
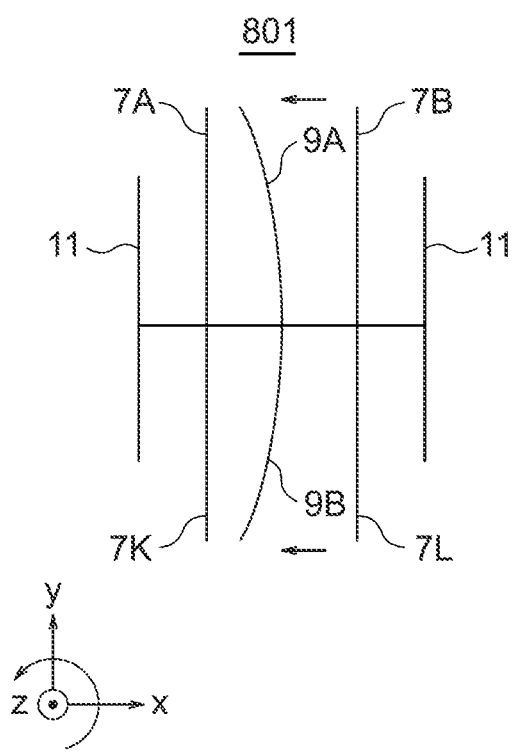

FIG. 10C and FIG. 10D are schematic perspective views for explaining vibrations of the detection arms 9 due to the Coriolis force in the sensor element 801 according to the eighth embodiment for detecting the rotation around the z-axis. FIG. 10C and FIG. 10D correspond to the states in FIG. 9B and FIG. 9C.

As explained with reference to FIG. 9B and FIG. 9C, in the piezoelectric body 703, conversely to the piezoelectric body 303 according to the fourth embodiment, the two detection arms 9 vibrate with phases whereby they are displaced to mutually the same sides in the y-axis direction. Accordingly, when the sensor element 801 is rotated around the z-axis in the state where the two detection arms 9 are vibrating, conversely to the fourth embodiment, the two detection arms 9 receive the Coriolis force on the reverse sides relative to the rotation direction around the z-axis. From another viewpoint, the detection arms 9A and 9B vibrate so as to bend to mutually the same sides in the x-axis direction.

In order to add the signals generated in such detection arms 9A and 9B, for example, between the detection arms 9A and 9B, the detection electrodes 217A are mutually connected and the detection electrodes 217B are mutually connected. The connections are made by for example the plurality of wirings 19. Further, all detection electrodes 217 are connected through two among the four pads 13 to the detection circuit 105.

As described above, the angular velocity sensor or sensor element in the seventh or eighth embodiment includes an angular velocity sensor or sensor element in the first or second embodiment, therefore the same effects as those by the angular velocity sensor or sensor element in the first or second embodiment are obtained. For example, detection according to a new mode of vibration becomes possible.

Further, in the seventh and eighth embodiments, the piezoelectric body 703 has the drive arms 7K and 7L and detection arm 9B which extend from the frame 5 connected with the drive arms 7A and 7B and detection arm 9A toward the side opposite to the drive arms 7A and 7B and detection arm 9A. The drive circuit 103 (FIG. 2B or FIG. 4B) applies voltages to the drive arms 7A, 7B, 7K, and 7L so that the drive arm 7B and drive arm 7L which are positioned on the positive side of the x-axis direction relative to the detection arms 9 vibrate bending to mutually reverse sides in the x-axis direction, and the drive arm 7A and drive arm 7K which are positioned on the negative side of the x-axis direction relative to the detection arms 9 vibrate bending to mutually reverse sides in the x-axis direction.

Accordingly, one frame 5 is bent by two or more pairs of drive arms 7 extending toward the two sides of the y-axis direction. As a result, for example, the displacement of the detection arms 9 becomes larger, so improvement of detection sensitivity can be expected. Further, for example, in the same way as the third and fourth embodiments, the region on the negative side of the y-axis from the frame 5 which became dead space in the first or second embodiment can be effectively utilized.

Note that, in the example shown, in the piezoelectric body 703, the configuration on the positive side of the y-axis direction and the configuration on the negative side of the y-axis direction were linearly symmetrical shapes to each other. However, the shapes need not be these either. Specifically, in the case where the pair of drive arms 7A and 7B extend alongside each other from the frame 5 in the y-axis direction at the positions between the pair of supported parts 5a and spaced apart from each other in the x-axis direction and where the detection arm 9A extends from the frame 5 alongside the pair of drive arms 7A and 7B between the pair of drive arms 7A and 7B, it is sufficient that the drive arms 7K and 7L extend alongside each other from the frame 5 toward the opposite side to the pair of drive arms 7A and 7B at positions between the pair of supported parts 5a and become the two sides in the x-axis direction relative to the detection arm 9A. Further, it is sufficient that the detection arm 9B extend alongside the pair of drive arms 7K and 7L between the pair of drive arms 7K and 7L at a position between the pair of drive arms 7A and 7B in the x-axis direction.

Further, the configuration performing excitation as described above by the drive arms 7A, 7B, 7K, and 7L may be employed while one of the detection arms 9A and 9B may be omitted as well. Even in this case, the effects of realizing the bending of the frame 5 by the two or more pairs of drive arms 7 extending toward the two sides of the y-axis direction are obtained.

Ninth Embodiment

Figure 11A:
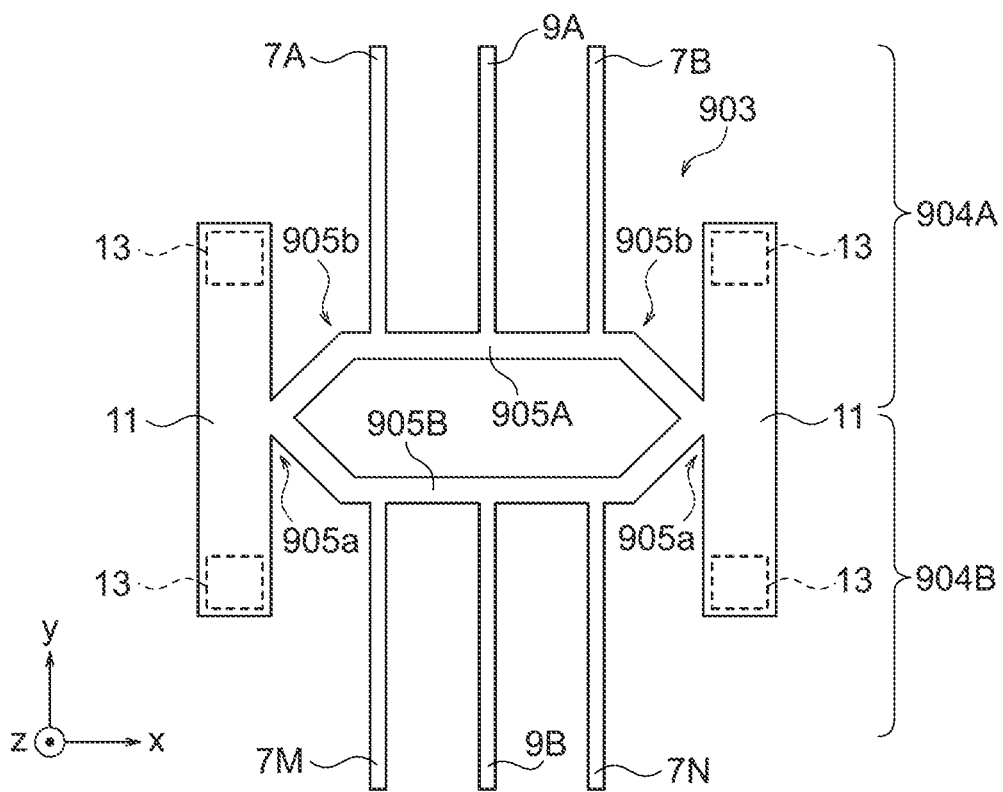
FIG. 11A is a plan view showing a sensor element according to a ninth embodiment.

FIG. 11A is a plan view showing a piezoelectric body 903 of a sensor element according to a ninth embodiment. This sensor element is supplied for detection of the angular velocity around the x-axis or around the z-axis.

The piezoelectric body 903 is one obtained by modifying the shape of the frame and the connection positions of the frame in the piezoelectric body 303 in the third or fourth embodiment. Specifically, each of the frames 905A and 905B in the units 904A and 904B does not linearly extend, but extends as if it were an upper base and a pair of legs of a trapezoid. Further, between the frames 905A and 905B, supported parts 905a joined to the mounting parts 11 are shared. The frames 905A and 905B are not connected to the mounting parts 11 independently from each other.

In this way, the shape of the frame may be a suitable shape. Other than the shape shown, for example, the frame may be bent as a whole or may be inclined relative to the x-axis as a whole. The drive arms 7 and/or detection arm 9 may extend from the portion in the frame which is inclined relative to the x-axis as well. Such modification may be applied to not only the third or fourth embodiments, but also to the first, second, and fifth to eighth embodiments and other aspects.

Note that, in the example shown, only a portion in the frame 905 which corresponds to the upper base of the trapezoid may be grasped as the frame, and the connection portions of the upper base and the legs may be grasped as the supported parts 905b. In this case, it can be said that the frame is linear.

10th Embodiment

Figure 11B:
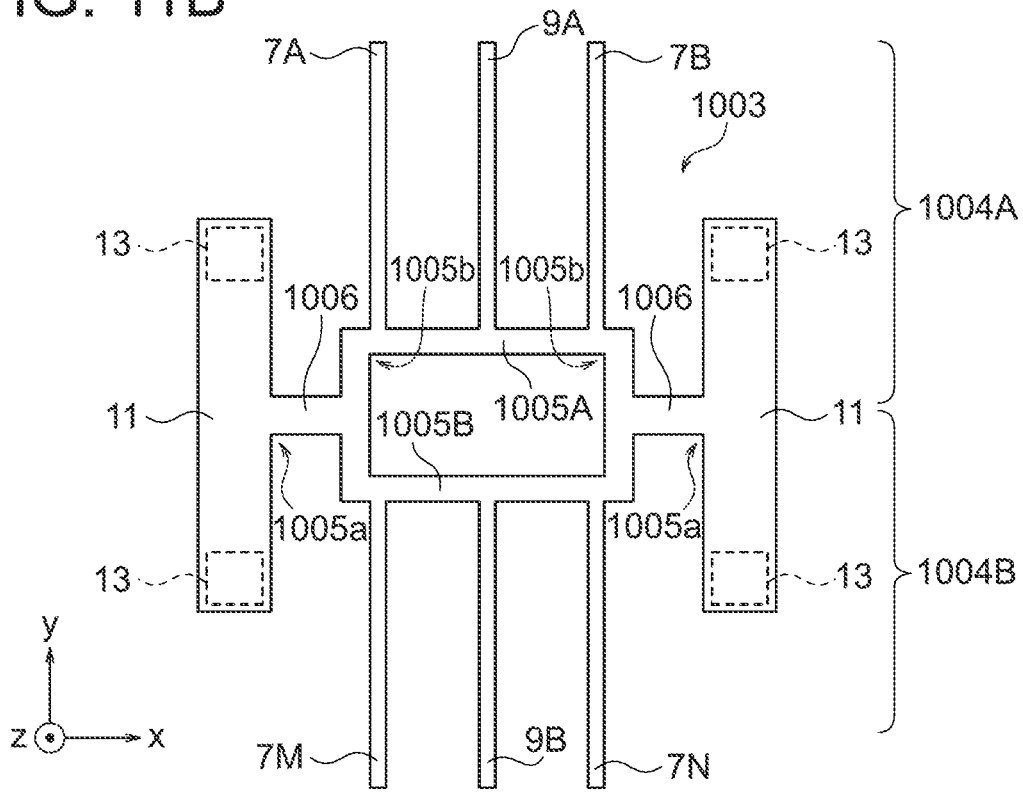
FIG. 11B is a plan view showing a sensor element according to a 10th embodiment.

FIG. 11B is a plan view showing a piezoelectric body 1003 in a sensor element according to a 10th embodiment. The sensor element is supplied for detection of the angular velocity around the x-axis or around the z-axis.

The piezoelectric body 1003, in the same way as the piezoelectric body 903 in the ninth embodiment, is one obtained by modifying the shape of the frame and the connection positions of the frame in the piezoelectric body 303 in the third or fourth embodiment. Specifically, each of the frames 1005A and 1005B in the units 1004A and 1004B includes a pair of common portions 1006 extending in the x-axis direction and a portion extending as if it were the three sides of a rectangle positioned between that pair. Further, between the frames 1005A and 1005B, the pair of common portions 1006 joined with the mounting parts 11 are shared.

In this way, the two frames may be made common with each other on the outer side from the drive arms 7 as well. Note that, in the example shown, the portion excluding the common portions 1006 from the frame 1005 may be grasped as the frames and the connection parts of the above portion as the frames and the common portions 1006 may be grasped as the supported parts, or the corner portions of the rectangle may be grasped as the supported parts 1005b and only one side of the rectangle may be grasped as the frame.

<Multi-Axis Angular Velocity Sensor>
(Overall Configuration)

Figure 12:
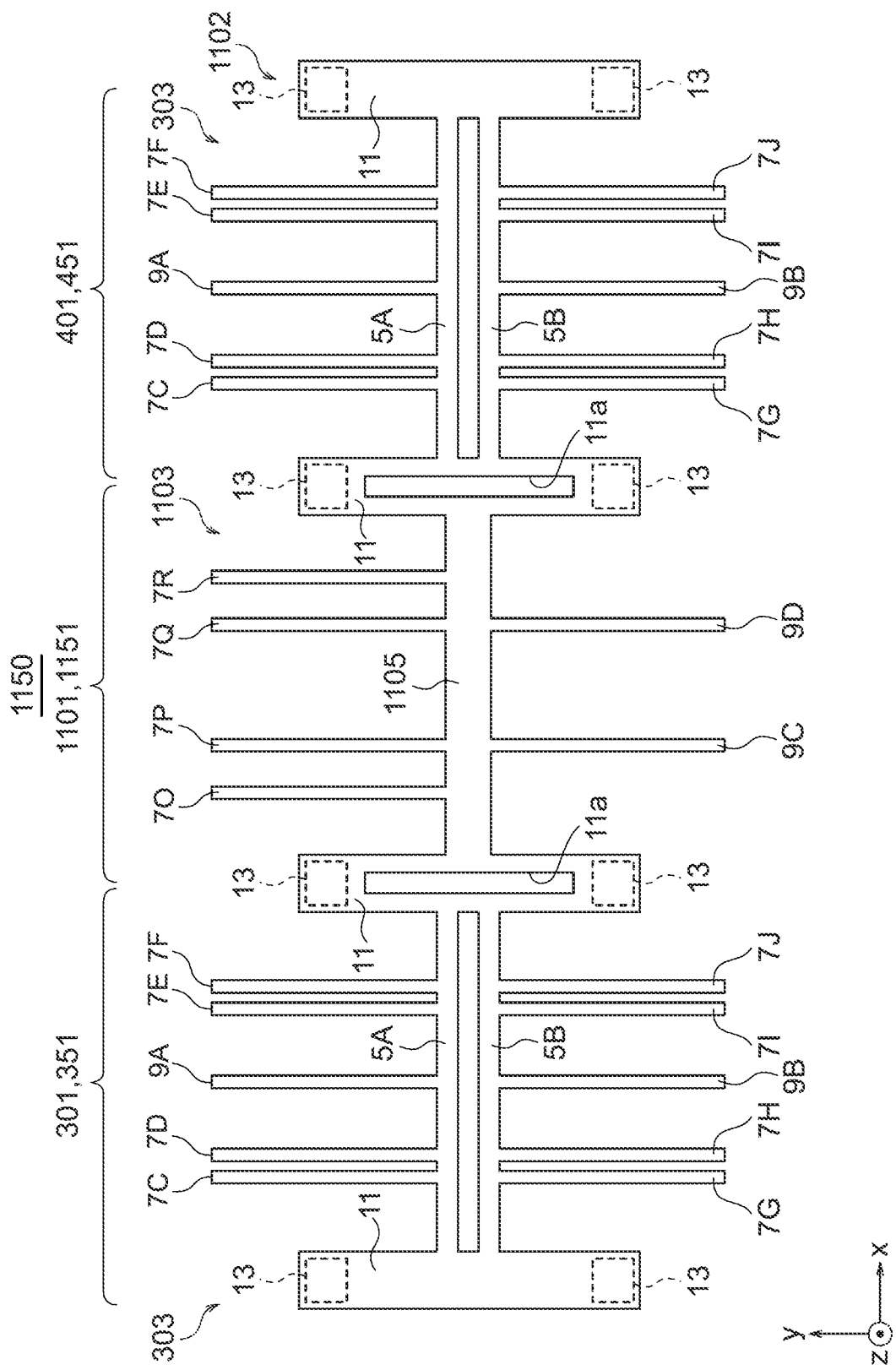
FIG. 12 is a plan view showing the configuration of a multi-axis angular velocity sensor.

FIG. 12 is a plan view showing the configuration of a multi-axis angular velocity sensor 1150 including an angular velocity sensor explained above.

The multi-axis angular velocity sensor 1150 has for example an x-axis sensor 351 detecting the angular velocity around the x-axis, a y-axis sensor 1151 detecting the angular velocity around the y-axis, and a z-axis sensor 451 detecting the angular velocity around the z-axis. Note that, in the example shown, the angular velocity sensor according to the third embodiment is shown as the x-axis sensor 351, and the angular velocity sensor according to the fourth embodiment is shown as the z-axis sensor 451. However, the x-axis sensor 351 and the z-axis sensor 451 may be replaced by the angular velocity sensors in the other embodiments explained above as well.

The x-axis sensor 351 has a sensor element 301, a drive circuit 103 (FIG. 2B) applying voltages to the sensor element 301, and a detection circuit 105 (FIG. 2C) detecting the signals from the sensor element 301. The configurations and operations of them are as already explained.

The z-axis sensor 451 has a sensor element 401, a drive circuit 103 (FIG. 4B) applying voltages to the sensor element 401, and a detection circuit 105 (FIG. 4C) detecting the signals from the sensor element 401. The configurations and operations of them are as already explained.

The y-axis sensor 1151 has a sensor element 1101, a drive circuit 103 (FIG. 2B) applying voltages to the sensor element 1101, and a detection circuit 105 (FIG. 2C) detecting the signals from the sensor element 1101.

The y-axis sensor 1151, in the same way as the x-axis sensor 351 and z-axis sensor 451, is a piezoelectric vibration type. The sensor element 1101 has a piezoelectric body 1103. The piezoelectric body 1103 has for example a base part 1105, one or more drive arms 7 and one or more detection arms 9 which are supported by the base part 1105, and a pair of mounting parts 11 supporting he base part 1105.

The sensor element 301, sensor element 1101, and sensor element 401 are for example aligned in the x-axis direction. Note that, the order of arrangement of these three sensor elements may be other than the shown order as well. The piezoelectric bodies in these sensor elements are for example integrally formed and are fixed to each other. That is, the multi-axis angular velocity sensor 1150 has a piezoelectric body 1102 including the piezoelectric body 303 in the sensor element 301, the piezoelectric body 1103 in the sensor element 1101, and the piezoelectric body 303 in the sensor element 401. Specifically, for example, these piezoelectric bodies are fixed so that the mounting parts 11 are shared by the mutually neighboring piezoelectric bodies, therefore the piezoelectric body 1102 has four mounting parts 11 in total.

In a mounting part 11 shared by the piezoelectric bodies of two sensor elements neighboring each other, a through hole 11a is formed. The through hole 11a is for example a slit shape penetrating in the z-axis direction and extending in the y-axis direction (direction along the mounting part 11) with substantially a constant width. The pads 13 are for example positioned on the outer sides of the through hole 11a in the y-axis direction. Due to the formation of the through hole 11a, for example, mutual influences of vibrations of the sensor elements are mitigated.

In the x-axis sensor 351, y-axis sensor 1151, and z-axis sensor 451, the drive circuit 103 may be shared. From another viewpoint, the frequencies when exciting the piezoelectric bodies of these three angular velocity sensors may be made the same. At this time, the pairs of pads 13 for excitation may be shared among the three angular velocity sensors. Accordingly, it is sufficient that the multi-axis angular velocity sensor 1150 include eight pads in total including the two pads 13 for excitation and the two pads 13 for detection in each of the angular velocity sensors. In the example shown, the eight pads 13 are respectively provided at the end parts of the four mounting parts 11 shared as explained above. Note that, the drive circuit 103 may also not be shared in a part or all of the three angular velocity sensors. In this case, more than eight pads 13 may be provided at suitable positions in the mounting parts 11. Further, in this case, the frequencies when exciting the three angular velocity sensors may differ from each other or may be the same as each other.

(Y-Axis Sensor)

The y-axis sensor 1151 may be given various configurations including known configurations. In the following description, one example thereof will be explained.

The piezoelectric body 1103 is for example configured linearly symmetrically relative to a not shown symmetrical axis parallel to the y-axis and has four (two pairs of) drive arms 70, 7P, 7Q, and 7R extending from the base part 1105 toward one side (positive side in the example shown) of the y-axis direction and two detection arms 9C and 9D extending from the base part 1105 toward the side opposite to the drive arms 7.

Figure 13A:
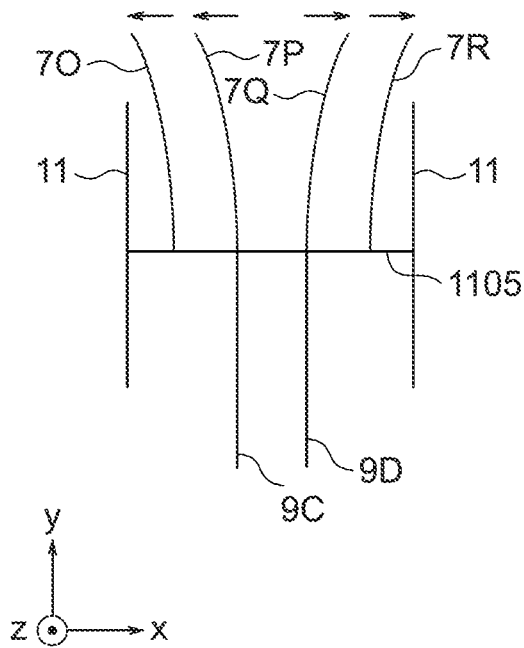
FIG. 13A, FIG. 13B, FIG. 13C, and FIG. 13D are schematic views for explaining the modes of operation of y-axis sensors included in the multi-axis angular velocity sensor in FIG. 12.
Figure 13B:
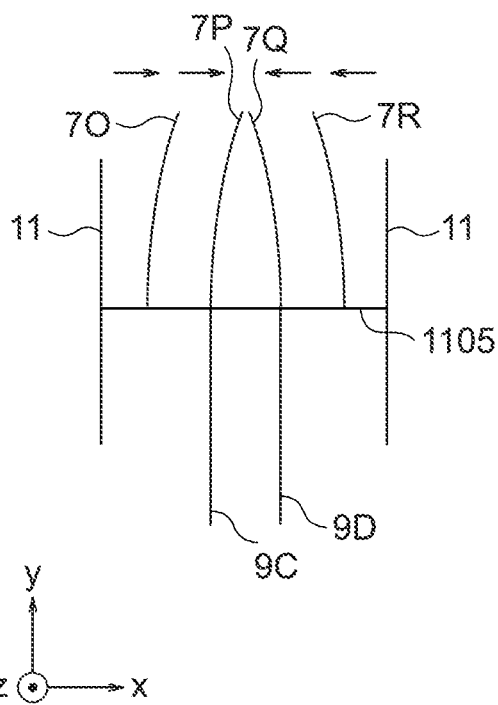

FIG. 13A and FIG. 13B are schematic plan views for explaining the excitation states of the piezoelectric body 1103.

The four drive arms 70, 7P, 7Q, and 7R, for example, in the same way as the drive arms 7C, 7D, 7E, and 7F in the third or fourth embodiment, are excited so that the two positioned on the same side (positive side or negative side) in the x-axis direction bend to mutually the same sides in the x-axis direction, and the two positioned on the positive side in the x-axis direction and the two positioned on the negative side in the x-axis direction bend to mutually reverse sides in the x-axis direction. Note that, by vibrations of these drive arms 7, the base part 1105 need not bend and the detection arms 9C and 9D need not vibrate.

As understood from the above operations, the arrangement and connections of the excitation electrodes 15 in the piezoelectric body 1103 may be the same as those in the third or fourth embodiment. Further, all excitation electrodes 15 are connected through two pads 13 to the drive circuit 103.

Figure 13C:
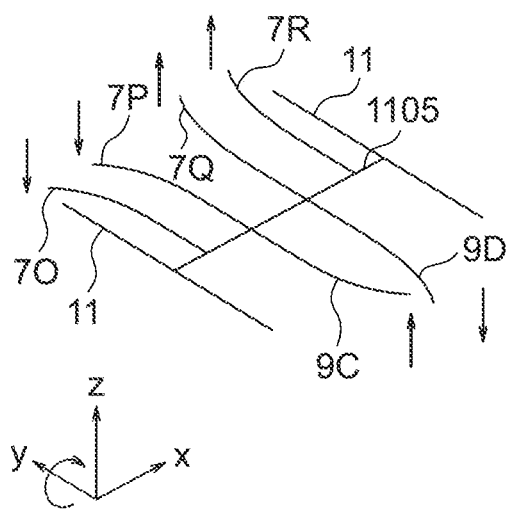
Figure 13D:
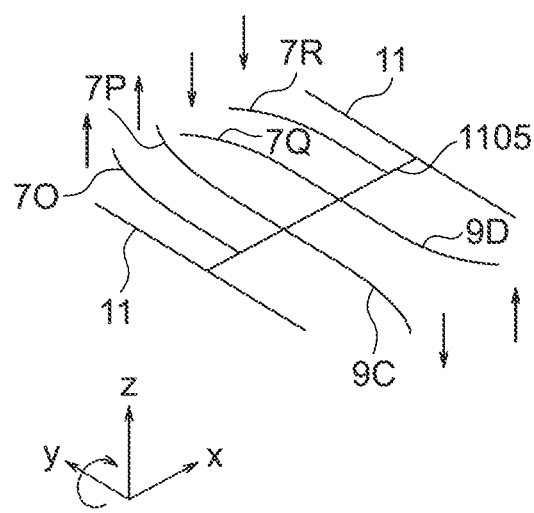

FIG. 13C and FIG. 13D are schematic perspective views for explaining the vibration due to the Coriolis force of the piezoelectric body 1103.

When the piezoelectric body 1103 is rotated around the y-axis in the state where the drive arms 7 are vibrated as described above, the Coriolis force acts upon the drive arms 7 in the direction (z-axis direction) perpendicular to the vibration direction (x-axis direction) and to the rotation axis (y-axis). As a result, the drive arms 7 vibrate so as to deform to bend in the z-axis direction. The drive arms 70 and 7P positioned on the negative side in the x-axis direction and the drive arms 7Q and 7R positioned on the positive side in the x-axis direction is vibrating to mutually reverse sides in the x-axis direction, therefore they vibrate so as to bend to the same side around the rotation axis (around the y-axis). That is, the two vibrate so as to bend to mutually reverse sides in the z-axis direction.

The vibrations in the z-axis direction of these drive arms 7 are transferred through the base part 1105 to the detection arms 9C and 9D. Further, the detection arms 9 vibrate so as to bend to the reverse side in the z-axis direction to the drive arms 7 positioned on the same side in the x-axis direction. Further, the two detection arms 9 vibrate so as to bend to mutually reverse sides in the z-axis direction.

In order to extract the signals generated in such detection arms 9, for example, in each detection arm 9, detection electrodes 17 having arrangements and connections as shown in the first embodiment (FIG. 2A and FIG. 2B) are provided. Further, in order to add the signals of the two detection arms 9 which bend to mutually reverse sides, between the two detection arms 9, the detection electrode 17A and the detection electrode 17B are connected by the wiring 19. Further, all detection electrodes 17 are connected through two pads 13 to the detection circuit 105.

The y-axis sensor may have various configurations other than the configuration described above, for example, one having eight drive arms and two detection arms disclosed in Japanese Patent Publication No. 2015-99130A, a tuning-fork shaped one having one drive arm and one detection arm, and one having a pair of drive arms and pair of detection arms all of which extend toward the same side in the y-axis direction. It may be a sensor which does not have a mounting part, but is mounted at the base part as well.

Note that, in the above embodiments, except for the drive arms 7O to 7R of the y-axis sensor, all of the drive arms 7 are examples of the first drive arms. Except for the detection arms 9C and 9D of the y-axis sensor, all of the detection arms 9 are examples of the detection arms. In the seventh and eighth embodiments, the drive arms 7A and 7B are examples of the pair of first drive arms, and the drive arms 7K and 7L are examples of the pair of second drive arms. The excitation electrode 15A is an example of the first excitation electrode, and the excitation electrode 15B is an example of the second excitation electrode. The detection electrode 17A is an example of the first detection electrode, and the detection electrode 17B is an example of the second detection electrode. The detection electrode 217A is an example of the first detection electrode from another viewpoint, and the detection electrode 217B is an example of the second detection electrode from another viewpoint. The drive arms 7O to 7R according to the y-axis sensor are examples of the y-axis drive arms, and the detection arms 9C and 9D according to the y-axis sensor are examples of the y-axis detection arms.

The present invention is not limited to the above embodiments and may be executed in various aspects.

The piezoelectric body need not to have mounting parts extending in the y-axis direction as shown in the embodiments either. For example, it may be mounted by provision of a plurality of pads at the two ends of the frame as well. That is, in the frame, the portions provided with the pads may be defined as supported parts as well.

The drive arms and detection arms need not be parallel to the y-axis either so far as they extend in the y-axis direction. The piezoelectric body may have a configuration that has only (at least) one pair of drive arms extending toward one side in the y-axis direction and one detection arm extending toward the other side in the y-axis direction (shape like a fork branched to two) as well. That is, the pair of drive arms and the detection arms need not extend in the same direction (alongside each other). In this case, for example, there is no possibility of the drive arms and the detection arms abutting against each other in the x-axis direction. A combination of a number of the drive arms and a number of the detection arms all of which extend from one frame is suitable. For example, with respect to a pair of drive arms, a detection arm extending toward the positive side in the y-axis direction and a detection arm extending toward the negative side in the y-axis direction may be provided as well. Further, between the pair of drive arms, two or more detection arms extending alongside each other may be provided as well.

The sensor element or angular velocity sensor may be configured as a portion of an MEMS (micro electromechanical system). In this case, a piezoelectric body configuring a sensor element may be mounted on the substrate of the MEMS, or the substrate of the MEMS may be configured by a piezoelectric body and the piezoelectric body of the sensor element may be configured by a portion thereof.

The multi-axis angular velocity sensor may be one having only two among the x-axis sensor, y-axis sensor, and z-axis sensor as well. In the embodiments, the piezoelectric bodies of the three angular velocity sensors were aligned in the x-axis direction, but may be aligned in the y-axis direction or be aligned in an L-shape as well. Further, among the piezoelectric bodies in the three angular velocity sensors, only two may be fixed to each other, or all of them may be separately formed and be mounted in the same package or substrate.

REFERENCE SIGNS LIST

1 . . . sensor element, 3 . . . piezoelectric body, 5 . . . frame, 5a . . . supported part, 7 . . . drive arm (first drive arm), 9 . . . detection arm, 103 . . . drive circuit, and 105 . . . detection circuit.

The invention claimed is:

1. An angular velocity sensor comprising:
   a piezoelectric body comprising:
      a first linear frame in an orthogonal coordinate system xyz including a first and second supported parts disposed linearly symmetrically relative to a symmetrical axis passing in a y-axis direction through a center of the first frame between the first and second supported parts, the first frame including an outer edge extending substantially straight from the first supported part through the symmetrical axis to the second supported part, the first and second supported parts spaced apart from each other in an x-axis direction,
      a pair of first drive arms which extend alongside each other from the first frame in the y-axis direction at positions between the first and second supported parts and spaced apart from each other in the x-axis direction, and
      a first detection arm which extends from the first frame in the y-axis direction at a position between the pair of first drive arms in the x-axis direction;
   a drive circuit which applies voltages of mutually reverse phases to the pair of first drive arms so that the pair of first drive arms vibrate bending to mutually reverse sides in the x-axis direction; and
   a detection circuit which detects signals generated due to bending deformation of the first detection arm,
   wherein the detection circuit detects the signals generated due to bending deformation in the x-axis direction of the first detection arm,
   wherein the first frame extends linearly from the center in the positive x-axis direction to the first supported part beyond one of the pair of the first drive arms located at the positive x-axis direction related to the first detection arm,
   wherein the first frame extends linearly from the center in the negative x-axis direction to the second supported part beyond the other of the pair of the first drive arms located at the negative x-axis direction related to the first detection arm, and
   wherein the first frame is configured to vibrate between the supported parts according to excitation of the drive arms and detection arm.

2. The angular velocity sensor according to claim 1, wherein the first detection arm is located at the center between the pair of first drive arms.

3. The angular velocity sensor according to claim 1, wherein the pair of first drive arms only extends on one side of a y-axis in the y-axis direction, or the pair of first drive arms and one or more other drive arms extending alongside the pair of first drive arms only extends on one side of the y-axis in the y-axis direction.

4. The angular velocity sensor according to claim 3, wherein the piezoelectric body further comprises:
a second linear frame located on an opposite side of the y-axis as the pair of first drive arms with respect to the first frame, including a third and fourth supported parts disposed linearly symmetrically relative to a symmetrical axis passing in the y-axis direction through a center of the second frame between the third and fourth supported parts, the second frame including an outer edge extending substantially straight from the third supported part through the symmetrical axis to the fourth supported part, the third and fourth supported parts spaced apart from each other in an x-axis direction,
a pair of second drive arms which extends alongside each other from the second frame in the y-axis direction and to the opposite side of the y-axis as the pair of first drive arms wherein the pair of second drive arms extends from the second frame at positions between the third and fourth supported parts and spaced apart from each other in the x-axis direction, and
a second detection arm which extends from the second frame in the y-axis direction on a same side of the y-axis as the pair of second drive arms and at a position between the pair of second drive arms in the x-axis direction, wherein
the first detection arm extends from the first frame on a same side of the y-axis in the y-axis direction as the pair of first drive arms extends.

5. The angular velocity sensor according to claim 1, further comprising:
a pair of second drive arms which extends alongside each other from the first frame toward the opposite side to the pair of first drive arms at positions between the first and second supported parts and spaced apart from each other in the x-axis direction, wherein
the drive circuit applies voltages to the pair of first drive arms and to the pair of second drive arms so that a first drive arm and a second drive arm among the pair of first drive arms and the pair of second drive arms which are located on a positive side in the x-axis direction relative to the first detection arm vibrating and bending to mutually reverse sides in the x-axis direction and so that the first drive arm and the second drive arm among the pair of first drive arms and the pair of second drive arms which are located on a negative side in the x-axis direction relative to the first detection arm vibrating and bending to mutually reverse sides in the x-axis direction.

6. The angular velocity sensor according to claim 1, further comprising:
a pair of first excitation electrodes which are located on a pair of first surfaces facing a positive side in the z-axis direction and a negative side in the z-axis direction in each of the pair of first drive arms,
a pair of second excitation electrodes which are located on a pair of second surfaces facing a positive side in the x-axis direction and a negative side in the x-axis direction in each of the pair of first drive arms,
a pair of first detection electrodes which, in the first detection arm, are located on a pair of third surfaces facing the two sides of the z-axis direction,
a pair of second detection electrodes which, in the first detection arm, are located on a pair of fourth surfaces facing the two sides of the x-axis direction, and
a plurality of wirings mutually connecting the pair of first excitation electrodes in each of the pair of first drive arms, mutually connecting the pair of second excitation electrodes in each of the pair of first drive arms, connecting the pair of first excitation electrodes and the pair of second excitation electrodes between the pair of drive arms, mutually connecting the pair of first detection electrodes, and mutually connecting the pair of second detection electrodes, wherein
the drive circuit applies voltages through the plurality of wirings to the pair of first excitation electrodes and the pair of second excitation electrodes in each of the pair of drive arms, and
the detection circuit detects the voltages between the pair of first detection electrodes and the pair of second detection electrodes through the plurality of wirings.

7. A sensor element comprising:
a piezoelectric body comprising:
a linear frame in an orthogonal coordinate system xyz including a first and second supported parts disposed linearly symmetrically relative to a symmetrical axis passing in a y-axis direction through a center of the frame between the first and second supported parts, the frame including an outer edge extending substantially straight from the first supported part through the symmetrical axis to the second supported part, the first and second supported parts spaced apart from each other in an x-axis direction;
a pair of drive arms extending alongside each other from the frame in the y-axis direction at positions spaced apart from each other in the x-axis direction in the orthogonal coordinate system xyz, and
a detection arm extending from the frame in the y-axis direction at a position between the pair of drive arms in the x-axis direction;
a plurality of excitation electrodes in an arrangement capable of applying voltages exciting the pair of drive arms in the x-axis direction;
a plurality of detection electrodes in an arrangement capable of detecting signals generated due to vibration of the detection arm in the x-axis direction;
a plurality of pads which are located in the piezoelectric body at positions closer to a positive side in the x-axis direction and a negative side in the x-axis direction than the pair of drive arms; and
a plurality of wirings connecting the plurality of excitation electrodes so that voltages of mutually reverse phases are applied from the plurality of excitation electrodes to the pair of drive arms so that the pair of drive arms vibrate bending to mutually reverse sides in the x-axis direction,
wherein the frame extends linearly from the center in the positive x-axis direction to the first supported part beyond one of the pair of the first drive arms located at the positive x-axis direction related to the first detection arm,
wherein the frame extends linearly from the center in the negative x-axis direction to the second supported part beyond the other of the pair of the first drive arms located at the negative x-axis direction related to the first detection arm, and
wherein the frame is configured to vibrate between the supported parts according to excitation of the drive arms and detection arm.

8. A multi-axis angular velocity sensor comprising:
an x-axis sensor detecting an angular velocity around an x-axis in an orthogonal coordinate system xyz;
a y-axis sensor detecting an angular velocity around a y-axis; and
a z-axis sensor detecting an angular velocity around a z-axis, wherein
the x-axis sensor is an angular velocity sensor comprising:
a piezoelectric body in the x-axis sensor comprising:
a first linear frame in an orthogonal coordinate system xyz including a first and second supported parts disposed linearly symmetrically relative to a symmetrical axis passing in a y-axis direction through a center of the first frame between the first and second supported parts, the first frame including an outer edge extending substantially straight from the first supported part through the symmetrical axis to the second supported part, the first and second supported parts spaced apart from each other in an x-axis direction,
a pair of first drive arms which extend alongside each other from the first frame in the y-axis direction at positions between the first and second supported parts and spaced apart from each other in the x-axis direction, and
a first detection arm which extends from the first frame in the y-axis direction at a position between the pair of first drive arms in the x-axis direction;
a drive circuit which applies voltages of mutually reverse phases to the pair of first drive arms so that the pair of first drive arms vibrate bending to mutually reverse sides in the x-axis direction; and
a detection circuit which detects signals generated due to bending deformation of the first detection arm,
wherein the detection circuit detects the signals generated due to bending deformation in a z-axis direction of the first detection arm,
the y-axis sensor comprises:
a piezoelectric body in the y-axis sensor comprising a y-axis drive arm and y-axis detection arm each extending in the y-axis direction,
a y-axis drive circuit applying voltages to the y-axis drive arm so that the y-axis drive arm vibrates in the x-axis direction, and
a y-axis detection circuit detecting the signals generated due to bending deformation in the z-axis of the detection arm,
wherein the z-axis sensor is the angular velocity sensor according to claim 1.

9. The multi-axis angular velocity sensor according to claim 8, wherein the piezoelectric body in the x-axis sensor, the piezoelectric body in the y-axis sensor, and the piezoelectric body in the z-axis sensor are fixed to each other.

10. The angular velocity sensor according to claim 1, wherein in the positive x-axis direction, a length from the one of the pair of the first drive arms to the first supported part is the same as or longer than a length from the detection arm to the one of the pair of the first drive arms, and
wherein in the negative x-axis direction, a length from the other of the pair of the first drive arms to the second supported part is the same as or longer than a length from the detection arm to the other of the pair of the first drive arms.

11. The sensor element according to claim 7, wherein in the positive x-axis direction, a length from the one of the pair of the first drive arms to the first supported part is the same as or longer than a length from the detection arm to the one of the pair of the first drive arms, and
wherein in the negative x-axis direction, a length from the other of the pair of the first drive arms to the second supported part is the same as or longer than a length from the detection arm to the other of the pair of the first drive arms.

* * * * *